(12) United States Patent
Aiken et al.

(10) Patent No.: US 10,263,131 B2
(45) Date of Patent: Apr. 16, 2019

(54) PARALLEL INTERCONNECTION OF NEIGHBORING SOLAR CELLS WITH DUAL COMMON BACK PLANES

(71) Applicant: SolAero Technologies Corp., Albuquerque, NM (US)

(72) Inventors: Daniel Aiken, Cedar Crest, NM (US); Lei Yang, Albuquerque, NM (US); Daniel Derkacs, Albuquerque, NM (US)

(73) Assignee: SolAero Technologies Corp., Albuquerque, NM (US)

( * ) Notice: Subject to any disclaimer, the term of this patent is extended or adjusted under 35 U.S.C. 154(b) by 144 days.

(21) Appl. No.: 14/719,111

(22) Filed: May 21, 2015

(65) Prior Publication Data

US 2016/0233366 A1 Aug. 11, 2016

Related U.S. Application Data

(63) Continuation-in-part of application No. 14/592,519, filed on Jan. 8, 2015.

(Continued)

(51) Int. Cl.
*H01L 31/05* (2014.01)
*H01L 31/0735* (2012.01)
(Continued)

(52) U.S. Cl.
CPC .......... *H01L 31/0516* (2013.01); *B64G 1/443* (2013.01); *H01L 31/047* (2014.12);
(Continued)

(58) Field of Classification Search
CPC ... H01L 31/47; H01L 31/049; H01L 31/0516; H01L 31/0735; H01L 31/0508; H01L 31/05
See application file for complete search history.

(56) References Cited

U.S. PATENT DOCUMENTS 4,045,245 A * 8/1977 Coleman ............... H01L 31/042
136/244
4,235,643 A 11/1980 Amick
(Continued)

FOREIGN PATENT DOCUMENTS

EP 3043390 B1 7/2016
JP 2001-351418 A 12/2001
(Continued)

OTHER PUBLICATIONS

U.S. Appl. No. 14/729,412, filed Jun. 3, 2015, Tourino et al.
(Continued)

*Primary Examiner* — Bethany L Martin

(57) ABSTRACT

A solar assembly or module comprising a plurality of solar cells and a support, the support comprising a conductive layer or back plane on each planar side. Each one of the plurality of solar cells is placed on the first conductive portion with the first contact electrically connected to the first conductive portion so that the solar cells are connected in parallel through the first conductive portion. A second contact of each solar cell can be connected to the second conductive portion so that the first and second conductive portions form terminals of opposite conductivity type. The modules can be interconnected to form a string or an electrical series connection of discrete modules by overlapping and bonding the first terminal of a first module with the second terminal of a second module.

18 Claims, 29 Drawing Sheets

Related U.S. Application Data

(60) Provisional application No. 61/976,108, filed on Apr. 7, 2014.

(51) Int. Cl.
*H01L 31/047* (2014.01)
*H01L 31/049* (2014.01)
*B64G 1/44* (2006.01)

(52) U.S. Cl.
CPC ........ *H01L 31/049* (2014.12); *H01L 31/0504* (2013.01); *H01L 31/0735* (2013.01); *Y02E 10/50* (2013.01)

(56) References Cited

U.S. PATENT DOCUMENTS

| | | | |
|---|---|---|---|
| 4,321,417 A | 3/1982 | Kurth et al. | |
| 4,832,755 A * | 5/1989 | Barton | H01L 31/048 136/251 |
| 6,034,322 A | 3/2000 | Pollard | |
| 7,053,294 B2 * | 5/2006 | Tuttle | H01L 31/0322 136/244 |
| 7,095,050 B2 | 8/2006 | Wanlass et al. | |
| 7,122,398 B1 | 10/2006 | Pichler | |
| 7,671,270 B2 | 3/2010 | Fang | |
| 8,093,675 B2 | 1/2012 | Tsunemi et al. | |
| 8,097,484 B1 | 1/2012 | Yang et al. | |
| 8,148,628 B2 | 4/2012 | Fang | |
| 8,753,918 B2 | 6/2014 | Varghese et al. | |
| 8,841,157 B2 | 9/2014 | Rekow | |
| 8,865,505 B2 | 10/2014 | Nakahama et al. | |
| 8,987,042 B2 | 3/2015 | Varghese et al. | |
| 9,287,438 B1 | 3/2016 | Varghese et al. | |
| 2006/0235717 A1 | 10/2006 | Sharma et al. | |
| 2008/0023065 A1 | 1/2008 | Borden et al. | |
| 2008/0276981 A1 | 11/2008 | Kinoshita et al. | |
| 2008/0289680 A1 | 11/2008 | MacFarlane | |
| 2009/0050190 A1 | 2/2009 | Nishida et al. | |
| 2009/0301543 A1 | 12/2009 | Reddy et al. | |
| 2010/0012172 A1 * | 1/2010 | Meakin | H01L 31/048 136/251 |
| 2010/0012175 A1 | 1/2010 | Varghese et al. | |
| 2010/0018565 A1 * | 1/2010 | Funakoshi | H01L 31/022433 136/244 |
| 2010/0089435 A1 * | 4/2010 | Lockenhoff | H01L 31/048 136/246 |
| 2010/0116310 A1 | 5/2010 | Shimizu et al. | |
| 2010/0186804 A1 | 7/2010 | Cornfeld | |
| 2010/0282288 A1 | 11/2010 | Cornfeld | |
| 2010/0288331 A1 | 11/2010 | Weibezahn | |
| 2010/0294358 A1 * | 11/2010 | Nakanishi | H01L 24/29 136/256 |
| 2011/0011454 A1 | 1/2011 | Taira | |
| 2011/0073185 A1 | 3/2011 | Nishimiya et al. | |
| 2011/0083716 A1 | 4/2011 | Meakin et al. | |
| 2012/0060895 A1 | 3/2012 | Rubin et al. | |
| 2012/0186629 A1 | 7/2012 | Nowlan | |
| 2012/0211047 A1 | 8/2012 | Cornfeld | |
| 2012/0305081 A1 | 12/2012 | Mizuno et al. | |
| 2013/0263920 A1 | 10/2013 | Fidaner et al. | |
| 2013/0298963 A1 | 11/2013 | Greiff et al. | |
| 2014/0166067 A1 * | 6/2014 | McGlynn | H01L 31/03926 136/244 |
| 2014/0166102 A1 | 6/2014 | Bende | |
| 2014/0318602 A1 | 10/2014 | Black | |
| 2015/0162485 A1 | 6/2015 | Varghese et al. | |
| 2015/0280044 A1 | 10/2015 | Derkacs et al. | |
| 2015/0287865 A1 | 10/2015 | Aiken et al. | |
| 2015/0364631 A1 | 12/2015 | Aiken et al. | |

FOREIGN PATENT DOCUMENTS

| | | |
|---|---|---|
| JP | 2008-034609 A | 2/2008 |
| JP | 2008-300440 A | 12/2008 |
| JP | 2009-059921 A | 3/2009 |
| JP | 2009-076849 A | 4/2009 |
| JP | 2009-164204 A | 7/2009 |
| JP | 2010-093188 A | 4/2010 |
| JP | 2010-157652 A | 7/2010 |
| JP | 2010-287378 A | 12/2010 |
| JP | 2011-155041 A | 8/2011 |
| JP | 2012-119343 A | 6/2012 |
| JP | 2013-115233 A | 6/2013 |
| JP | 2015-065276 A | 4/2015 |
| WO | WO 2010/113880 A1 | 10/2010 |

OTHER PUBLICATIONS

U.S. Appl. No. 14/729,422, filed Jun. 3, 2015, Tourino et al.
U.S. Appl. No. 14/795,461, filed Jul. 9, 2015, Clevenger et al.
Search Report and Written Opinion dated Mar. 21, 2016 for Belgian patent application No. BE2015/5494, 11 pgs.
Search Report and Written Opinion dated Mar. 30, 2016 for Belgian patent application No. BE2015/5499, 14 pgs.
Search Report and Opinion dated May 27, 2016 for European patent application No. 15176553.4, 5 pgs.
Search Report and Opinion dated May 27, 2016 for European patent application No. 16150567.2, 7 pgs.

* cited by examiner

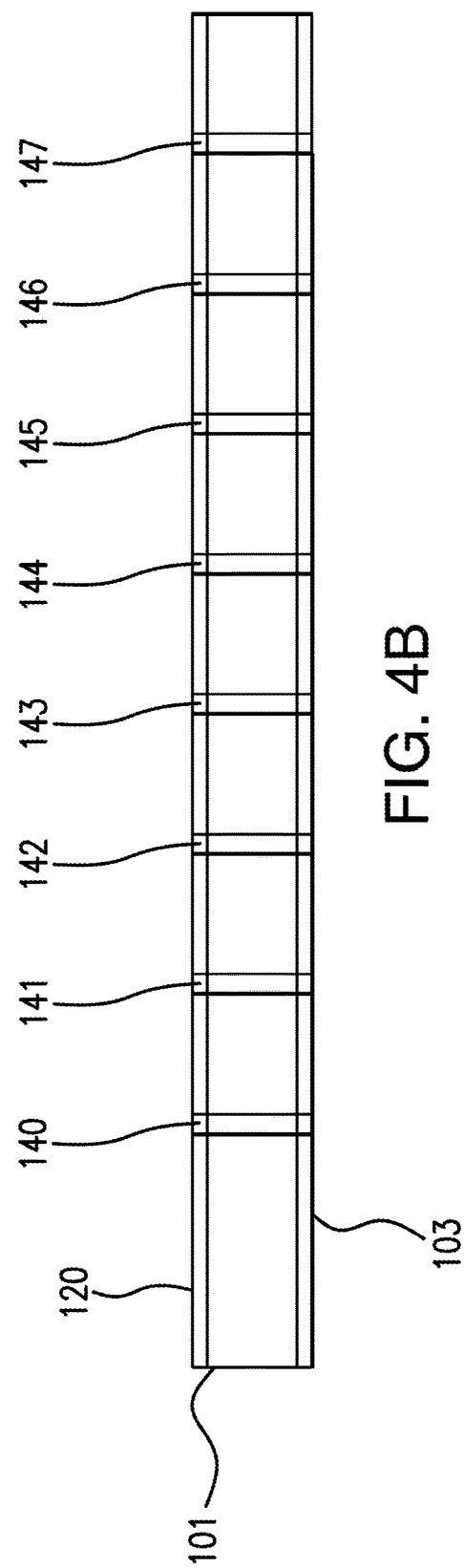

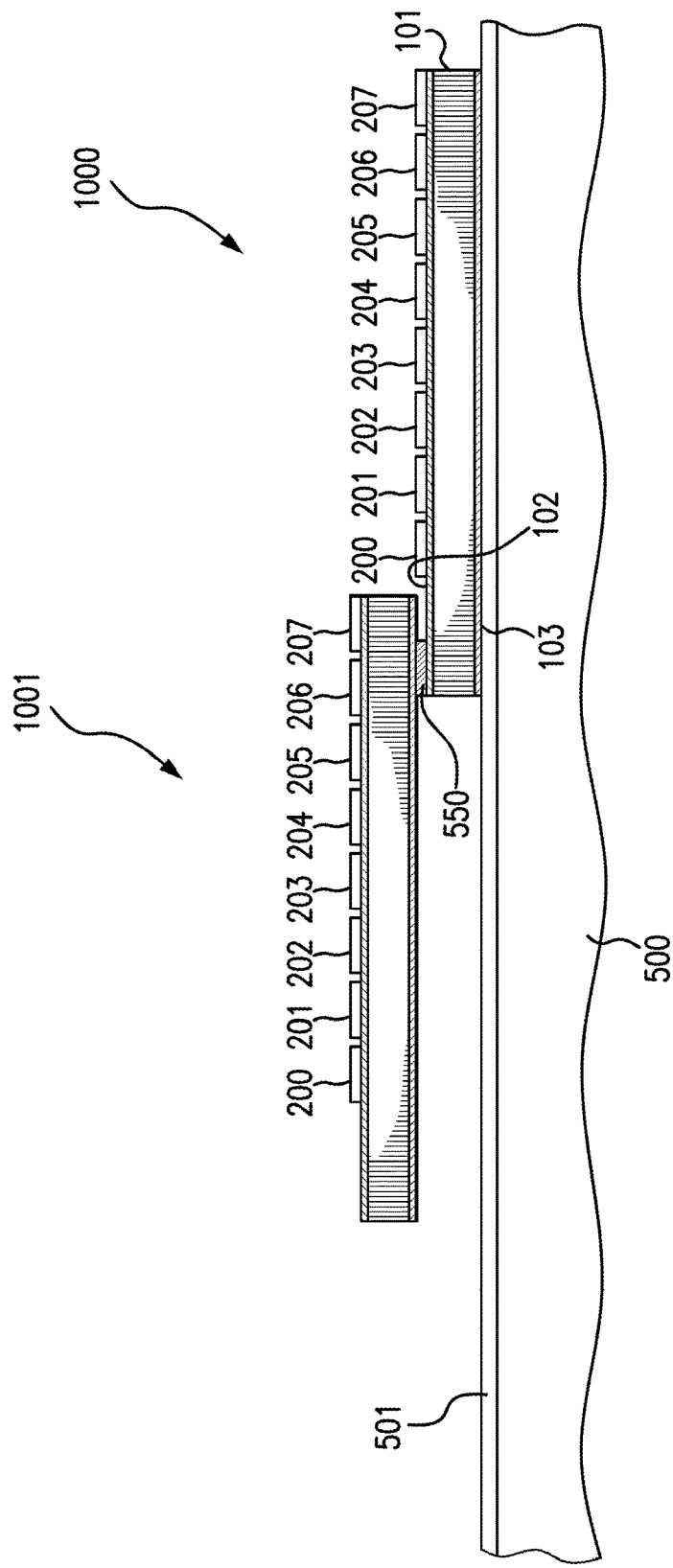

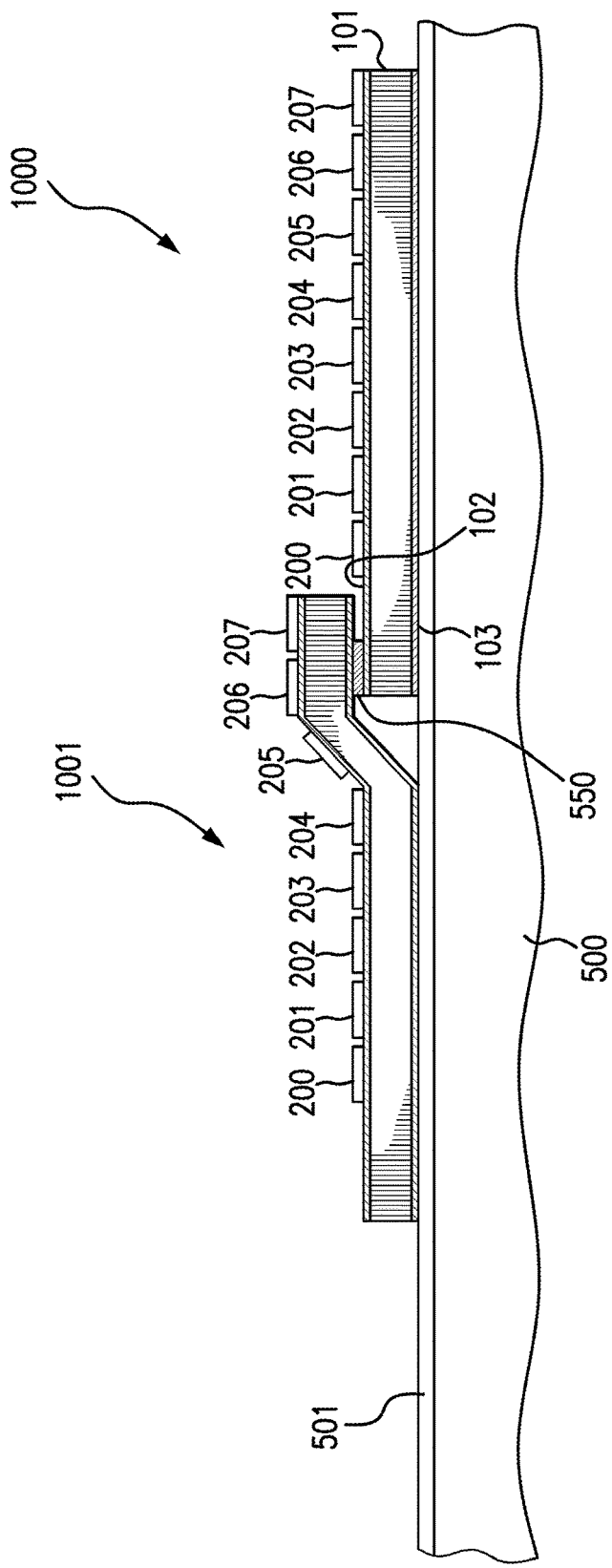

PARALLEL INTERCONNECTION OF NEIGHBORING SOLAR CELLS WITH DUAL COMMON BACK PLANES

REFERENCE TO RELATED APPLICATIONS

The present application is a continuation-in-part of U.S. patent application Ser. No. 14/592,519 filed Jan. 8, 2015, which claims the benefit of U.S. Provisional Application No. 61/976,108, filed Apr. 7, 2014.

BACKGROUND OF THE DISCLOSURE

1. Field of the Invention

The present invention relates to the field of photoelectric solar cell arrays, and to fabrication processes utilizing, for example multijunction solar cells based on III-V semiconductor compounds fabricated into multi-cell modules or subassemblies of such solar cells, and an automated process for mounting and interconnection of such subassemblies on a substrate or panel.

2. Description of the Related Art

Solar power from photovoltaic cells, also called solar cells, has been predominantly provided by silicon semiconductor technology. In the past several years, however, high-volume manufacturing of III-V compound semiconductor multijunction solar cells for space applications has accelerated the development of such technology not only for use in space but also for terrestrial solar power applications. Compared to silicon, III-V compound semiconductor multijunction devices have greater energy conversion efficiencies and generally more radiation resistance, although they tend to be more complex to manufacture. Typical commercial III-V compound semiconductor multijunction solar cells have energy efficiencies that exceed 27% under one sun, air mass 0 (AM0), illumination, whereas even the most efficient silicon technologies generally reach only about 18% efficiency under comparable conditions. Under high solar concentration (e.g., 500×), commercially available III-V compound semiconductor multijunction solar cells in terrestrial applications (at AM1.5D) have energy efficiencies that exceed 37%. The higher conversion efficiency of III-V compound semiconductor solar cells compared to silicon solar cells is in part based on the ability to achieve spectral splitting of the incident radiation through the use of a plurality of photovoltaic regions with different band gap energies, and accumulating the current from each of the regions.

Typical III-V compound semiconductor solar cells are fabricated on a semiconductor wafer in vertical, multijunction structures. The individual solar cells or wafers are then disposed in horizontal arrays, with the individual solar cells connected together in an electrical series circuit. The shape and structure of an array, as well as the number of cells it contains, are determined in part by the desired output voltage and current.

In satellite and other space related applications, the size, mass and cost of a space vehicle or satellite power system are dependent on the power and energy conversion efficiency of the solar cells used. Putting it another way, the size of the payload and the availability of on-board services are proportional to the amount of power provided. Thus, as payloads become more sophisticated and require more power, both the power-to-weight ratio (measured in watts per kg) and power-to-area ratio (measured in watts per square meter) of a solar cell array or panel becomes increasingly more important, and there is increasing interest in lighter weight, densely packed solar cell arrays having both high efficiency and low mass.

Space applications frequently use high efficiency multi-junction III/V compound semiconductor solar cells. Compound semiconductor solar cell wafers are often costly to produce. Thus, the waste that has conventionally been accepted in the art when cutting the rectangular solar cell out of the substantially circular solar cell wafer, can imply considerable cost.

Solar cells are often produced from circular or substantially circular wafers sometimes 100 mm or 150 mm in diameter. Large solar cells (i.e. with, for example, an area from 25 to 60 $cm^2$ representing one-quarter or more of the area of the wafer) are conventionally preferred so as to minimize the costs associated with the assembly of the solar cells onto a support to form a solar cell module. However, the use of large solar cells results in poor wafer utilization, and large solar cells often present issues of defects or variation in the material quality across the surface of the wafer. Also, larger solar cells are fragile and present handling challenges during subsequent fabrication steps that result in breakage of the wafer or solar cells and corresponding lower manufacturing yield. Moreover, large solar cells of predetermined size cannot be easily or efficiently accommodated on panels of arbitrary aspect ratios and configurations which may vary depending upon the "wing" configuration of the satellite or space vehicle. Also, large solar cells are rigid and can sometimes be problematic in terms of meeting requirements for flexibility of the solar cell assembly or solar array panel. Sometimes, flexibility is desired so that the solar cell assembly or the solar array panel can be bent or rolled, for example, so that it is displaceable between a stowed position in which it is wound around a mandrel or similar, and a deployed position extending outward from, for example, a space vehicle so as to permit the solar cells to receive sunlight over a substantial area. Sometimes, large solar cells can be problematic from the perspective of providing a flexible assembly or panel that can be readily bent, wound, etc. without damage to the solar cells and their interconnections.

It is possible to reduce the amount of waste by dividing a circular or substantially circular wafer not into one or two single cells, but into a large number of smaller cells. By dividing a circular or substantially circular wafer into a large amount of relatively small cells, most of the wafer surface can be used to produce solar cells, and the waste is reduced. For example, a solar cell wafer having a diameter of 100 mm or 150 mm and a surface area in the order of 80 $cm^2$ or 180 $cm^2$ can be used to produce a large amount of small solar cells, such as square or rectangular solar cells, each having a surface area of less than 5 $cm^2$, or in some embodiments less than 1 $cm^2$, less than 0.1 $cm^2$, less than 0.05 $cm^2$, or less than 0.01 $cm^2$. For example, substantially rectangular—such as square—solar cells can be obtained in which the sides are less than 10, 5, 3, 2, 1 or even 0.5 mm long. Thereby, the amount of waste of wafer material can be substantially reduced, and at the same time high utilization of the wafer surface can be obtained. Also, when dividing a solar cell wafer into a relatively large number of solar cells, solar cells obtained from a more or less defective region of the wafer can be discarded, or "binned" as lower performance solar cells, that is, not used for the manufacture of the solar cell assemblies. Thus, a relatively high quality of the solar cell assemblies in terms of performance of the solar cells can be achieved, while the amount of waste is kept relatively low.

However, the use of a large number of relatively small solar cell involves the drawback that for a given effective surface area of the final solar cell assembly or solar array panel, there is an increased number of interconnections between solar cells, in a parallel and/or in series, which may render the process of manufacturing the solar cell assembly or the panel more complex and/or expensive, and which may also render the entire circuit less reliable, due to the risk for low reliability, low yield, or other manufacturing difficulties or errors due to defective or less-than-ideal interconnections between individual solar cells.

SUMMARY OF THE DISCLOSURE

1. Objects of the Disclosure

It is an object of the present invention to provide an improved multijunction solar cell assembly or module comprising a plurality of solar cells.

It is an object of the present invention to provide a platform or substrate for the series and/or parallel connection of discrete groups of solar cells.

It is an object of the present invention to provide a lightweight solar cell assembly or module that is suitable for automated manufacturing processes.

It is another object of the invention to provide a flexible solar cell array module with high W/kg and W/m$^2$ and low cost.

It is another object of the invention to provide a solar cell assembly or module that utilizes an array of small solar cells, for example, solar cells each having a surface area of less than 5 cm$^2$, or in some embodiments less than 1 cm$^2$, less than 0.1 cm$^2$, less than 0.05 cm$^2$, or less than 0.01 cm$^2$, for example, substantially rectangular—such as square—solar cells in which the (longest) sides are less than 10, 5, 3, 2, 1 or even 0.5 mm long.

It is another object of the invention to provide for methods for producing solar cell assemblies or modules.

It is another object of the invention to provide for a solar array panel comprising a plurality of interconnected modules, and methods for producing a solar array panel.

Some implementations or embodiments may achieve fewer than all of the foregoing objects.

2. Features of the Disclosure

Briefly, and in general terms, the present disclosure relates to a modular solar assembly comprising a support comprising a first side and an opposing second side; a first conductive layer comprising a first conductive portion disposed on the first side of the support; a second conductive layer comprising a second conductive portion disposed on the second side of the support; a plurality of solar cells mounted on the first side of the support, each solar cell of the plurality of solar cells comprising a top surface including a contact of a first polarity type, such as a cathode contact, and a rear surface including a contact of a second polarity type, such as an anode contact; the contact of the second polarity type of each of the plurality of solar cells making electrical contact with the first conductive portion of the first conductive layer; a plurality of vias in the support extending from the first side of the support to the second conductive portion on the second side of the second support; a plurality of conductive interconnects extending from the first side of the support to the second conductive portion on the second side of the support, each respective interconnect making electrical contact with the contact of the first polarity type of a respective solar cell and extending through a respective via to make electrical contact with the second conductive portion of the second conductive layer disposed on the second side of the support; a first terminal of the module disposed on the second side of the support and connected to the second conductive portion; and a second terminal of the module disposed on the first side of the support and connected to the first conductive portion.

In some embodiments of the disclosure, the second terminal comprises or is made up of part of the first conductive layer, and the first terminal comprises or is made up of part of the second conductive layer.

In some embodiments the assembly further comprises a bypass diode which can be mounted on, for example, any of the first and second surfaces and function as a bypass diode for the entire solar cell assembly or subportions or groups of solar cells thereof. Bypass diodes are frequently used in solar cell assemblies comprising a plurality of series connected solar cells or groups of solar cells. One reason for the use of bypass diodes is that if one of the solar cells or groups of solar cells is shaded or damaged, current produced by other solar cells, such as by unshaded or undamaged solar cells or groups of solar cells, can flow through the by-pass diode and thus avoid the high resistance of the shaded or damaged solar cell or group of solar cells. The bypass diodes can be mounted on one of the metal layers and comprise an anode terminal and a cathode terminal. The diode can be electrically coupled in parallel with the semiconductor solar cells and configured to be reverse-biased when the semiconductor solar cells generate an output voltage at or above a threshold voltage, and configured to be forward-biased when the semiconductor solar cells generate an output voltage below the threshold voltage. Thus, when the solar cell assembly is connected in series with other solar cell assemblies, the bypass diode can serve to minimize the deterioration of performance of the entire string of solar cell assemblies when one of the solar cell assemblies is damaged or shaded.

In another aspect, the present disclosure provides a modular solar cell assembly and its method of fabrication comprising a support comprising a first side and an opposing second side; a first conductive layer comprising a first conductive portion disposed on the first side of the support, a second conductive layer comprising a second conductive portion disposed on the second side of the support.

In some embodiments, a plurality of solar cells are mounted on the first side of the support, each solar cell of the plurality of solar cells comprising a top surface including a contact of a first polarity type (such as a cathode contact in embodiments in which the solar cell is an n-on-p configuration), and a rear surface including a contact of a second polarity type (such as an anode contact in embodiments in which the solar cell is an n-on-p configuration); the contact of second polarity type of each of the plurality of solar cells making electrical contact with the first conductive portion of the first conductive layer.

In some embodiments, a plurality of vias in the support are provided extending from the first side of the support to the second side of the support, and a plurality of conductive interconnects are provided extending from the first side of the support to the second side of the support, each respective interconnect making electrical contact with the contact of the first polarity type of a respective solar cell and extending through a respective via to make electrical contact with the second conductive layer disposed on the second side of the support.

In some embodiments, a first terminal of the module is disposed on the second side of the support and connected to the second conductive portion; and a second terminal of the module is disposed on the first side of the support and connected to the first conductive portion.

In some embodiments, the first conductive portion comprises a plurality of parallel strips of equal width. In other embodiments of the invention, the first conductive portion comprises a plurality of strips having a width that varies along the strip, for example, a width that increases from a free end of the strip to an end of the strip where the strip is electrically connected to the second terminal. For example, the strips can have a substantially triangular configuration.

In some embodiments, the second conductive portion comprises a planar surface covering the entire rear surface of the support, or a plurality of parallel strips on the rear surface. In other embodiments of the invention, the second conductive portion comprises a plurality of strips having a width that varies along the strip, for example, a width that increases from a free end of the strip to an end of the strip where the strip is electrically connected to the first terminal. For example, the strips can have a substantially triangular configuration.

A reason for the use of strips having a width that varies along the strip on either the top or the rear surface is that when current flows in one direction, such as from a free end of the strip towards an end of the strip where the strip is connected to the terminal, the amount of current increases along the strip, as more and more solar cells mounted on the strip are connected in electrical series, and contribute to the total current flowing in the strip. Thus, the closer one gets to the end of the strip where the strip is connected to the terminal, the higher the need for a substantial cross section of the conductive material in order to carry the current and avoid overheating or excessive losses. Thus, varying the width of the strips and thus the cross sectional area of the conductive material in accordance with the increase in current, optimizes the use of conductive material and thus implies a saving in terms of weight, which is important especially in space applications.

In some embodiments, the first conductive portion is a metallic layer that has a thickness in the range of 5 to 50 microns.

In some embodiments, a plurality of solar cells are disposed closely adjacent to one another on each of the strips by a distance between 5 and 25 microns.

In some embodiments, each of the solar cells have a dimension in the range of 0.5 to 10 mm on a side In some embodiments, the support is a polyimide film having a thickness of between 25 and 100 microns.

In some embodiments, the via has a diameter of between 100 and 200 microns.

In some embodiments, the first terminal of the module is disposed on a first peripheral edge of the module.

In some embodiments, the second terminal of the module is composed of a metallic strip extending parallel to the first peripheral edge of the module.

In some embodiments of the disclosure, the first terminal and the second terminal are arranged in correspondence with opposite peripheral edges of the support.

The arrangement of the present disclosure makes it possible to connect a plurality of assemblies in series by arranging the assemblies one after the other in a partly overlapping manner, for example, in a way similar to the way in which roofing tiles are arranged on a roof, so that the second terminal of one of the assemblies contacts the first terminal of another one of the assemblies. This provides for easy electrical and mechanical interconnection without any use of discrete, complex interconnect elements, and the laborious welding or soldering of the interconnect elements to the terminals. The terminals of adjacent assemblies can be directly placed in contact with each other and attached using suitable bonding means, such as soldering or welding.

In some embodiments, the bypass diode has a top terminal of a first polarity type and a bottom terminal of a second polarity type, and the bottom terminal is mounted on and electrically connected to the first conductive layer.

In some embodiments of the disclosure, at least the first conductive portion comprises a plurality of strips, wherein said vias are arranged between adjacent strips. The solar cells can thus be arranged on the strips, for example, with one or two rows of solar cells on each strip, and interconnects such as simple wires, such as wire bonded wires, can pass from the solar cells to the second conductive portion through vias arranged in rows parallel with said rows of solar cells, and arranged between the strips. In some embodiments of the disclosure, the strips have one free end and another end where the strips are connected to the terminal.

In some embodiments, the assembly is an array of between 9 and 36 solar cells.

In some embodiments, the solar cells are multijunction II/V compound semiconductor solar cells.

It has been found that this arrangement is practical and appropriate for automated manufacturing processes. The solar cells can be tightly packed adjacent to one another at one side of the support, whereas the other side of the support is used as a conductive backplane to provide an electrical element that connects some or all of the solar cells in parallel. Also, the presence of terminals on both sides of the support facilitates interconnection and integration of the assemblies or modules into a solar array panel in a simply and highly ordinated manner and without need for special or discrete interconnects between the different modules. For example, a series of said solar cell modules or assemblies can be arranged in a row with the second terminal of one of the solar cell modules overlapping with and being bonded to the first terminal of a preceding solar cell module, etc. Thus, a simple and reliable mechanical and electrical series connection of solar cell modules can be established.

In another aspect, the present disclosure provides a solar array panel comprising a plurality of modular solar cell assemblies, each solar cell assembly including an interconnect which electrically and mechanically connects to the solar cell assembly with an adjacent solar cell assembly, and wherein each solar cell assembly includes a support comprising a first side and an opposing second side; a first conductive layer comprising a first conductive portion disposed on the first side of the support, a second conductive layer comprising a second conductive portion disposed on the second side of the support, a plurality of solar cells mounted on the first side of the support, each solar cell of the plurality of solar cells comprising a top surface including a contact of a first polarity type, and a rear surface including a contact of a second polarity type, the contact of second polarity type of each of the plurality of solar cells making electrical contact with the first conductive portion of the first conductive layer; a plurality of vias in the support extending from the first side of the support to the second side of the support; a plurality of conductive interconnects extending from the first side of the support to the second side of the support, each respective interconnect making electrical contact with the contact of the first polarity type of a respective solar cell and extending through a respective via to make electrical contact with the second conductive layer disposed on the second side of the support; a first terminal of the module disposed on the second side of the support and connected to the second conductive portion; and a second terminal of the module disposed on the first side of the support and connected to the first conductive portion.

In another aspect, the present disclosure provides a space vehicle and its method of fabrication comprising: a payload disposed on or within the space vehicle; and a power source for the payload, including an array of solar cell assemblies mounted on a panel, each solar cell assembly including a support comprising a first side and an opposing second side; a first conductive layer comprising a first conductive portion disposed on the first side of the support; a second conductive layer comprising a second conductive portion disposed on the second side of the support; a plurality of solar cells mounted on the first side of the support, each solar cell of the plurality of solar cells comprising a top surface including a contact of a first polarity type, and a rear surface including a contact of a second polarity type, the contact of second polarity type of each of the plurality of solar cells making electrical contact with the first conductive portion of the first conductive layer; a plurality of vias in the support extending from the first side of the support in a direction to the second side of the support; a plurality of conductive interconnects extending from the first side of the support in a direction to the second side of the support, each respective interconnect making electrical contact with the contact of first polarity type of a respective solar cell and extending through a respective via to make electrical contact with the second conductive layer disposed on the second side of the support, a first terminal of the module disposed on the second side of the support and connected to the second conductive portion; and a second terminal of the module disposed on the first side of the support and connected to the first conductive portion.

In another aspect, the present disclosure provides a solar cell assembly that comprises a plurality of solar cells and a support, the support comprising a conductive layer, such as a metal layer, comprising a first conductive portion. Each solar cell of said plurality of solar cells comprises a top or front surface and a bottom or rear surface and a bottom contact in correspondence with said rear surface. Each solar cell is placed on the first conductive portion with the bottom contact electrically connected to the first conductive portion so that the plurality of solar cells are connected in parallel through the first conductive portion. In the present disclosure, the term solar cell refers to a discrete solar cell semiconductor device or chip.

In another aspect, the present disclosure provides a method of manufacturing a solar cell assembly having between 16 and 100 solar cells, in which the solar cells are positioned and placed on a support in an automated manner by a pick and place assembly tool.

In another aspect, the present disclosure provides a method of manufacturing a solar cell assembly having between 16 and 100 solar cells, in which the solar cells are positioned and placed on a first conductive portion of a support, so that the solar cells can make up a substantial part of the upper surface of the support, such as more than 50%, 70%, 80%, 90%, 95% or more of the total surface of the support.

In another aspect, the present disclosure provides a method of manufacturing a solar cell assembly having between 16 and 100 solar cells, in which the solar cells are positioned and placed on a conductive portion of a support, so that the contact or contacts at the rear surface of each solar cell are electrically connected, which thus serves to interconnect the solar cells in parallel.

In some embodiments, the connection between the bottom contact of each solar cell and the first conductive portion of the metal layer of the support can be direct and/or through a conductive bonding material. Thus, this approach is practical for creating solar cell assemblies of a large amount of relatively small solar cells, such as solar cells obtained by dividing a solar cell wafer having a substantially circular shape into a large number of individual solar cells having a substantially rectangular shape, for enhanced wafer utilization. The first conductive portion is continuous and thus acts as a bus interconnecting the bottom contacts of the solar cells. In addition, the conductive layer, including the first conductive portion, can act as a thermal sink for the solar cells.

In some embodiments of the disclosure, the conductive layer comprises a second conductive portion of a second conductivity type separated from the first conductive portion of a first conductivity type, that is, the two conductive portions are not in direct contact with each other. For example, the two conductive portions can be arranged on different sides of an insulating support or core. Each of the plurality of solar cells comprises a top contact of a first conductivity type, and each of the plurality of solar cells is connected to the second conductive portion via the top contact by an interconnect connecting the top contact to the second conductive portion. Thus, a plurality of solar cells can be arranged on the support, connected in parallel with each other, with their bottom contacts (such as contacts coupled to a p-polarity side of the respective solar cell in some embodiments) connected to the first conductive portion and with their top contacts (such as contacts coupled to an n-polarity side of the respective solar cell) connected to the second conductive portion. The first and second conductive portions can serve as bus-bars allowing the connection of the solar cell assembly to other devices, such as to the other solar cell assemblies so as to make up a larger solar cell assembly.

In some embodiments of the disclosure, the first conductive portion and the second conductive portion are interconnected by means of at least one bypass diode. A bypass diode functions for routing electrical current around the solar cells. Bypass diodes are frequently used in solar cell assemblies comprising a plurality of series connected solar cells or groups of solar cells. If one of the solar cells or groups of solar cells is shaded or damaged, current produced by other solar cells, such as by unshaded or undamaged solar cells or groups of solar cells, can flow through the bypass diode and thus avoid the high resistance of the shaded or damaged solar cell or group of solar cells. The diodes can be mounted on the top side of the metal layer and comprise an anode terminal and a cathode terminal, with one terminal connected to the metal layer. The diode can be electrically coupled in parallel with the semiconductor solar cells and configured to be reverse-biased when the semiconductor solar cells generate an output voltage at or above a threshold voltage, and configured to be forward-biased when the semiconductor solar cells generate an output voltage below the threshold voltage.

In some embodiments of the disclosure, said at least one diode comprises a top side terminal and a rear side terminal, the diode being placed on the second conductive portion with said rear side terminal of the diode electrically coupled to the second conductive portion, the top side terminal of the diode being electrically coupled to the first conductive portion, for example, through a via in a support or core separating the first conductive portion from the second conductive portion. In an alternative embodiment of the disclosure, the diode can be placed on the first conductive portion with the rear side terminal of the diode being electrically coupled to the first conductive portion, the top side terminal of the diode being electrically coupled to the second conductive portion. Both alternatives are possible, but it may sometimes be preferred to use the first conductive portion to support the solar cells, and the second conductive portion to support the diode or diodes. In other embodiments, it can be preferred to have both the diode and the solar cells arranged on the same conductive portion, for example, on the same side of a support having the first conductive portion on one side and the second conductive portion on another side. Having all the solar cell and diode components on the same side of the support may sometimes serve to simplify the assembly process.

In some embodiments of the disclosure, the solar cell assembly comprises a plurality of rows of solar cells placed on the first conductive portion, each row of solar cells being connected to a subportion, such as a strip, of the second conductive portion, through vias arranged in rows extending in parallel with the solar cells.

In some embodiments of the disclosure, each solar cell has a surface area of less than 1 cm$^2$. The approach of the disclosure can be especially advantageous in the case of relatively small solar cells, such as solar cells having a surface area of less than 1 cm$^2$, less than 0.1 cm$^2$ or even less than 0.05 cm$^2$ or 0.01 cm$^2$. For example, substantially rectangular—such as square—solar cells can be obtained in which the sides are less than 10, 5, 3, 2, 1 or even 0.5 mm long. This makes it possible to obtain rectangular solar cells out of a substantially circular wafer with reduced waste of wafer material, and the approach of the disclosure makes it possible to easily place and interconnect a large number of said solar cells in a parallel, so that they, in combination, perform as a larger solar cell.

In some embodiments of the disclosure, each solar cell is bonded to the first conductive portion by a conductive bonding material. Using a conductive bonding material makes it possible to establish the connection between a bottom contact of each solar cell and the support by simply bonding the solar cell to the support using the conductive bonding material. The conductive bonding material can be selected to enhance heat transfer between solar cell and support.

In some embodiments of the disclosure, the conductive bonding material is an indium alloy. Indium alloys have been found to be useful and advantageous, in that the indium can make the bonding material ductile, thereby allowing the use of the bonding material spread over a substantial part of the surface of the support without making the support substantially more rigid and reducing the risk of formation of cracks when the assembly is subjected to bending forces. Preferably, support, solar cells and bonding material are matched to each other to feature, for example, similar thermal expansion characteristics. On the other hand, the use of a metal alloy, such as an indium alloy, is advantageous over other bonding material such as polymeric adhesives in that it allows for efficient heat dissipation into the underlying conductive layer, such as for example a copper layer. In some embodiments of the disclosure, the bonding material is indium lead.

In some embodiments of the disclosure, the conductive layer comprises copper.

In some embodiments of the disclosure, the support comprises a KAPTON® film, the conductive layer being placed on the KAPTON® film. The option of using a KAPTON® film for the support is practical for, for example, space applications.

In some embodiments of the disclosure, the contact of the second polarity type of each solar cell comprises a conductive, such as a metal, layer extending over a substantial portion of the rear surface of the respective solar cell, preferably over more than 50% of the rear surface of the respective solar cell, more preferably over more than 90% of the rear surface of the respective solar cell. In some embodiments of the disclosure, the contact of the second polarity type comprises a conductive, such as a metal, layer covering the entire rear surface of the solar cell. This helps to establish a good and reliable contact with the conductive portion of the conductive layer of the support.

In some embodiments of the disclosure, each solar cell comprises at least one III-V compound semiconductor layer. As indicated above, high wafer utilization can be especially advantageous when the solar cells are high efficiency solar cells such as III-V compound semiconductor solar cells, often implying the use of relatively expensive wafer material.

In some embodiments of the disclosure, the solar cell assembly has a substantially rectangular shape and a surface area in the range of 25 to 400 cm$^2$.

Another aspect of the disclosure relates to a solar array panel comprising a plurality of solar cell assemblies, each of these solar cell assemblies comprising a solar cell assembly according to one of the previously described aspects of the disclosure. As indicated above, the solar cell assemblies can advantageously serve as sub-assemblies which can be interconnected to form a major solar array panel, comprising, for example, an array of solar cell assemblies comprising a plurality of strings of such solar cell assemblies, each string comprising a plurality of solar cell assemblies connected in series. Thus, a modular approach can be used for the manufacture of relatively large solar array panels out of small solar cells, which are assembled to form assemblies as described above, whereafter the assemblies or modules are interconnected to form a panel.

In some embodiments of the disclosure, the step of providing a plurality of solar cells comprises obtaining a plurality of substantially rectangular solar cells, such as square solar cells, out of a substantially circular wafer. In some embodiments of the disclosure, each of said solar cells has a surface area of less than 1 cm$^2$. The approach of the disclosure can be especially advantageous in the case of relatively small solar cells, such as solar cells having a surface area of less than 1 cm$^2$, less than 0.1 cm$^2$ or even less than 0.05 cm$^2$ or 0.01 cm$^2$. For example, substantially rectangular—such as square—solar cells can be obtained in which the sides are less than 10, 5, 3, 2, 1 or even 0.5 mm long. This makes it possible to obtain rectangular solar cells out of a substantially circular wafer with a small waste of wafer material, whereas the approach of the disclosure makes it possible to easily place an interconnect a large number of said solar cells in parallel, so that they, in combination, perform as a larger solar cell.

A further aspect of the disclosure related to a method for forming a solar cell assembly comprising a plurality of solar cells on a support, the method of comprising the steps of:

providing a support with a first side and an opposing second side, the support having a first conductive layer on the first side of the support, and a second conductive layer on the second side of the suppoer, said conductive layers being separated by an insulating core;

establishing a plurality of vias through the support;

mounting a plurality of solar cells on the first side of the support, each solar cell of the plurality of solar cells comprising a top surface including a contact of a first polarity type (for example, a cathode contact), and a rear surface including a contact of a second polarity type (for example, an anode contact), so that the contact of second polarity type of each of the plurality of solar cells makes electrical contact with the first conductive layer;

arranging a plurality of conductive interconnects so that each respective interconnect makes electrical contact with the contact of the first polarity type of a respective solar cell and extends through a respective via to make electrical contact with the second conductive layer. In this way, solar cells can be packed close together on the first side of the support, and the first and the second metal layers can be used to interconnect all of the solar cells in parallel.

In some embodiments of the disclosure, the method comprises removing conductive material on the first side of the support so as to establish a plurality of conductive strips. In some embodiment of the disclosure, the vias are arranged adjacent to the strips, for example, between adjacent strips. In some embodiments of the disclosure, the strips are given a shape, such as a substantially triangular shape, so that the width of the strip increases from a free end of the strip to a terminal end where the strip is electrically connected to other strips. This arrangement can sometimes be preferred to optimize the use of conductive material and minimize weight. In other embodiments of the disclosure, the strips have constant width.

In some embodiments of the disclosure, the method comprises removing conductive material on the second side of the support so as to establish a plurality of conductive strips. In some embodiment of the disclosure, the vias are arranged adjacent to the strips, for example, between adjacent strips. In some embodiments of the disclosure, the strips are given a shape, such as a substantially triangular shape, so that the width of the strip increases from a free end of the strip to a terminal end where the strip is electrically connected to other strips. This arrangement can sometimes be preferred to optimize the use of conductive material and minimize weight. In other embodiments of the disclosure, the strips have constant width. In some embodiments of the disclosure, the removal of conductive material is carried out so that conductive strips are established having one free and being connected to each other at an opposite end.

In some embodiments of the invention, the method comprises the step of providing a second terminal on the first side of the support and a first terminal on the second side of the support, the first terminal comprising a portion of the second conductive layer extending adjacent a first edge of the support, and the second terminal comprising a portion of the first conductive layer extending adjacent to a second edge of the support, parallel with the first edge of the support. This can facilitate the interconnection of a plurality of assemblies in series when, for example, fabricating a solar array panel. For example, in some embodiments of the invention, the support is substantially rectangular and one solar cell assembly can be placed partially overlapping another one in correspondence with an edge, so that the first terminal of a second one of the solar cell assemblies is placed on top of the second terminal of the first solar cell assembly. Thereby, firm and reliable bonding and interconnection can be established without the use of any additional interconnects: the bonding can take place directly, using, for example, a suitable conductive soldering or welding material, such as an indium alloy, to attach the respective first and second terminals to each other. Thereby, a series of modules can be interconnected in series in a simple and reliable manner, so that a desired output voltage is obtained, and each solar cell assembly includes a substantial amount of solar cells connected in parallel, so as to establish a desired level of output current.

In some embodiments of the disclosure, the method comprises the step of providing a bypass diode on the assembly, in parallel with the solar cells. In some embodiments of the disclosure, the bypass diode is mounted on the first conductive layer and connected to the second conductive layer through a via in the support, and in other embodiments of the disclosure the bypass diode is mounted on the second conductive layer and connected to the first conductive layer through a via in the support. In some embodiments, more than one bypass diode is provided on each solar cell assembly.

In some embodiments of the disclosure, the method comprises the step of obtaining at least a plurality of the solar cells by dividing, for example cutting, at least one solar cell wafer into at least 10 substantially square or rectangular solar cells, such as into at least 100 or into at least 500 solar cells or more. In some embodiments of the disclosure, after dividing said at least one solar cell wafer into a plurality of substantially square or rectangular solar cells, some of said solar cells are selected so as not to be used for producing the solar cell assembly; the solar cells selected not to be used for producing the solar cell assembly may correspond to a defective region of the solar cell wafer. Thereby, overall efficiency of the solar cell assembly is enhanced.

In some embodiments of the disclosure, the solar cells have a surface area of less than 5 $cm^2$, or in some embodiments less than 1 $cm^2$, less than 0.1 $cm^2$, less than 0.05 $cm^2$, or less than 0.01 $cm^2$. For example, substantially rectangular—such as square—solar cells can be obtained in which the sides are less than 10, 5, 3, 2, 1 or even 0.5 mm long.

In some embodiments of the disclosure, the conductive interconnects are wires, and in some embodiments of the disclosure the method comprises wire ball bonding the wires to the contacts of the first polarity type and/or to the second conductive layer.

In some embodiments of the disclosure, the solar cells are III-V compound semiconductor multijunction solar cells. Such solar cells feature high efficiency but are relatively costly to manufacture. Thus, the reduced waste obtained by subdividing wafers into small solar cells is beneficial from a cost perspective. Also, the use of small solar cells can be advantageous to enhance flexibility of the solar cell assemblies.

In some embodiments of the disclosure, the solar cells are attached to the first conductive layer using a conductive bonding material, for example, an indium alloy. Advantages involved with the use of an indium alloy have been explained above.

A further aspect of the disclosure relates to a solar array panel comprising a plurality of solar cell assemblies including at least a first solar cell assembly and a second solar cell assembly, each solar cell assembly comprising a support having a first side and an opposing second side, with a first conductive layer disposed on the first side of the support and a second conductive layer disposed on the second side of the support, and a plurality of solar cells mounted on the first side of the support;

wherein the first solar cell assembly and the second solar cell assembly are connected in series, wherein the second solar cell assembly partially overlaps with the first solar cell assembly so that a portion of the second conductive layer of the second solar cell assembly overlaps with and is bonded to a portion of the first conductive layer of the first solar cell assembly. Thus, electrical series connection between the first solar cell assembly and the second solar cell assembly can be established by bonding the respective second and first layers to each other where the assemblies overlap. Thus, a direct and reliable connection can be established, without need for any additional interconnects. Two or more, such as three, four, five, ten, or more modules or assemblies can be connected in series, and the connections can be established without use of additional and/or complex interconnects. The direct connection can serve to simplify the manufacturing and facilitate automation thereof. In addition, as the interconnection can be established at a plurality of points along and across the overlapping portions, and/or over a substantial portion of the overlapping surface, the interconnection can be established in a very reliable manner, using welding or soldering techniques and, if desired, additional conductive bonding material that is placed between the overlapping portions and melted during the welding or soldering process. In some embodiments of the invention, an indium alloy can be used as a bonding material. Thus, solar cell assemblies or modules can be placed one after the other so as to form a solar array panel comprising a plurality of said solar cell assemblies, arranged in one or more strings of series connected solar cell assemblies, the solar cell assemblies within each string partly overlapping with each other, in a manner resembling the manner in which tiles are often arranged on the roofs of buildings, etc.

In some embodiments of the disclosure, the solar cell assemblies are flexible. Thus, when the solar cell assemblies are arranged on a substrate with a second solar cell assembly partly overlapping with a first solar cell assembly, the second solar cell assembly can, due to its flexibility, adapt so that part of it extends in parallel with the first solar cell assembly, that is, along a top surface of the substrate, whereas another part of it is curved so that it extends upwards from the substrate in the vicinity of an edge of the first solar cell assembly, and overlies a portion of the first solar cell assembly in the vicinity of said edge. Thus, in some embodiments of the disclosure, the solar cell assemblies are placed so that at least a second solar cell assembly partially overlaps at least a first solar cell assembly, whereby the second solar cell assembly adapts it shape accordingly, whereby part of the second solar cell assembly and at least part of the first solar cell assembly are arranged in one plane, and at least another part of the second solar cell assembly is arranged in a different plane, parallel with the first plane.

In some embodiments of the disclosure, the solar cells are distributed over a first portion of the first surface of each solar cell assembly, and a second portion of the first surface is free from solar cells, and the second solar cell assembly overlaps with the first solar cell assembly in correspondence with the second portion of the first surface of the first solar cell assembly. The first portion is preferably substantially larger than the second portion. For example, the first portion is preferably at least five times larger than the second portion, preferably at least ten times larger.

In some embodiments of the disclosure, each solar cell assembly comprises a first terminal comprising a conductive region on the second side of the support adjacent a first edge of the support, and a second terminal comprising a conductive region on the first side of the support adjacent a second edge of the support, opposite said first edge of the support. That is, the support can have a substantially rectangular shape, and the terminals can be arranged in correspondence with, that is, adjacent to opposite peripheral edges of the support and on opposite sides of the support. One or both of said terminals can correspond to a part of the corresponding conductive layer extending in parallel with and adjacent to the corresponding edge. Thereby, the solar cell assemblies can easily be arranged in a string, in a partly overlapping manner, so that the first terminal of the second solar cell assembly is placed on top of and in contact with the second terminal of the first solar cell assembly, and so on.

In some embodiments of the disclosure, the solar cells on each solar cell assembly are connected in parallel. Thus, each solar cell assembly can include an appropriate amount of solar cells so as to produce, when in use, a desired amount of output current. The voltage level can be determined by choosing the number of solar cell assemblies that are connected in series in each string.

In some embodiments of the disclosure, each solar cell comprises a top surface including a contact of a first polarity type, and a rear surface including a contact of a second polarity type, the contact of second polarity type of each of the plurality of solar cells making electrical contact with the first conductive layer and the contact of the first polarity type of each of the plurality of solar cells being electrically connected to the second conductive layer. Thus, the arrangement with two conductive layers on opposite sides of the substrate serves on the one hand to connect the solar cells on the module in parallel, and on the other hand to provide for a simple and reliable interconnection of a plurality of solar cell assemblies or modules in series, in the partially overlapping manner described above.

In some embodiments of the disclosure, each solar cell assembly comprises a plurality of vias in the support extending from the first side of the support to the second side of the support, and a plurality of conductive interconnects extend from the first side of the support to the second side of the support, each respective interconnect making electrical contact with the contact of the first polarity type of a respective solar cell and extending through a respective via to make electrical contact with the second conductive layer disposed on the second side of the support. That is, the solar cells arranged on the first side of the support and connected to the first conductive layer via their rear contacts, are connected to the second conductive layer via interconnects, such as wires, passing through respective vias in the support.

In some embodiments of the disclosure, the first conductive layer comprises a plurality of strips, such as substantially rectangular or triangular strips, extending across the first side of the support. In some embodiments of the disclosure, each strip has a free end adjacent to one edge of the support, and another end where the strip is connected to a part of the conductive layer that extends along another edge of the support and which constitutes or forms part of the second terminal. In the embodiments in which vias are present in the support, the vias can be arranged in parallel with the strips, between adjacent strips. The solar cell assemblies can be arranged on a substrate, glued to the substrate.

In some embodiments of the disclosure, the solar cells have a surface area of less than 5 cm$^2$, or in some embodiments less than 1 cm$^2$, less than 0.1 cm$^2$, less than 0.05 cm$^2$, or less than 0.01 cm$^2$. For example, substantially rectangular—such as square—solar cells can be used in which the sides are less than 10, 5, 3, 2, 1 or even 0.5 mm long.

In some embodiments of the disclosure, the solar cells are III-V compound semiconductor multijunction solar cells. Such solar cells feature high efficiency but are relatively costly to manufacture. Thus, the solar array panel can comprise a plurality of series connected modules, each of which comprises a large amount of small solar cells connected in parallel. Errors in individual solar cells will not substantially affect the performance of the entire module, and the modules can be interconnected as described to provide for a reliable interconnection, minimizing the risk for errors and enhancing the reliability of the performance of each string of modules.

A further aspect of the disclosure relates to a method of manufacturing a solar array panel, comprising the steps of:

providing a plurality of solar cell assemblies including at least a first solar cell assembly and a second solar cell assembly, each solar cell assembly comprising a support having a first side and an opposing second side, with a first conductive layer disposed on the first side of the support and a second conductive layer disposed on the second side of the support, and a plurality of solar cells mounted on the first side of the support;

placing the first solar cell assembly on a substrate;

placing the second solar cell assembly on the substrate so that the second solar cell assembly partially overlaps with the first solar cell assembly so that a portion of the second conductive layer of the second solar cell assembly overlaps with a portion of the first conductive layer of the first solar cell assembly;

bonding the portion of the second conductive layer to the portion of the first conductive layer, so as to establish a mechanical and electrical connection between the two conductive layers. The connection can be established at one or more specific points or areas of the overlap, for example, along and across the entire overlap or most of it, or only at specific points. The way in which the bonding is carried out can be selected to optimize the performance in terms of, for example, simplicity of manufacture, reliability of the electrical and/or mechanical connection, flexibility of the panel, etc.

The step of attaching the two portions to each other can, for example, include the step of applying heat and/or pressure. In some embodiments of the invention, a conductive soldering material is applied in the area of the overlap, for example, on the portion of the first conductive layer or on the portion of the second conductive layer, prior to bringing the two portions in contact with each other.

In some embodiments of the disclosure, the method comprises the step of applying a conductive soldering material onto a portion of the first conductive layer in correspondence with an edge of the first solar cell assembly, prior to placing the second solar cell assembly onto the structure.

In some embodiments of the disclosure, the solar cell assemblies are placed on the structure using at least one pick-and-place device.

In some embodiments of the disclosure, the supports are flexible so that the solar cell assemblies adapt their shape when placed on the structure, so that, for example, when the second solar cell assembly is placed on the structure partially overlapping with the first solar cell assembly, its shape is adapted so that, for example, a major portion of the second solar cell assembly is arranged on the structure and coplanar with a major portion of the first solar cell assembly, whereas a minor portion of the second solar cell assembly extends upwards from said structure and over a portion of the first solar cell assembly, in correspondence with an edge of the first solar cell assembly.

BRIEF DESCRIPTION OF THE DRAWINGS

To complete the description and in order to provide for a better understanding of the disclosure, a set of drawings is provided. Said drawings form an integral part of the description and illustrate embodiments of the disclosure, which should not be interpreted as restricting the scope of the disclosure, but just as examples of how the disclosure can be carried out. The drawings comprise the following figures:

FIG. 4B is a cross-sectional view of the support of FIG. 4A through the 4B-4B plane in FIG. 4A;

FIG. 7C is a schematic cross-sectional view of the second solar cell module shown in FIG. 7B being coupled with the first solar cell module shown in FIG. 7A during the third step of a panel assembly process;

FIG. 7D is a schematic cross-sectional view of the second solar cell module shown in FIG. 7C being mounted on the panel or supporting substrate during the fourth step of a panel assembly process.

DETAILED DESCRIPTION

Figure 1:
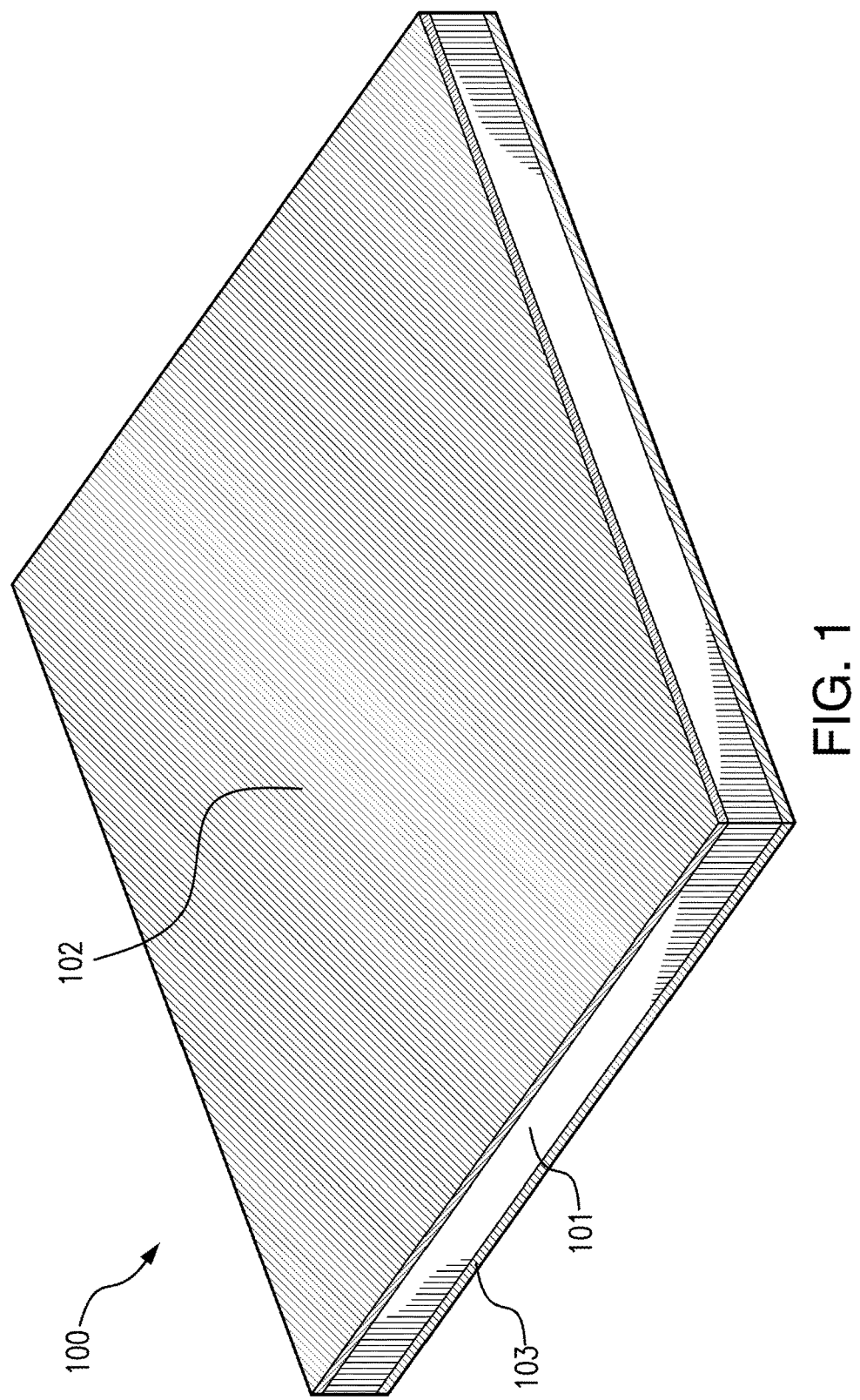
FIG. 1 is a perspective view of a support that can be used for fabricating a module according to the present disclosure depicting metallization over the top and bottom surfaces.

Details of the present disclosure will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The present disclosure provides a process for the design and fabrication of a modular solar cell subassembly, and the fabrication of a solar cell array panel utilizing such interconnected modular subassemblies.

FIG. 1 illustrates an example of a support 100 that can be used in an embodiment of the disclosure in the fabrication of the modular subassembly. The support comprises an insulating support layer 101 and a conductive metal layer 102 arranged on a top surface of the support layer 101 and a conductive metal layer 103 arranged on a bottom surface of the support layer 101. In some embodiments of the disclosure, the metal layer 102 is a copper layer, having a thickness in the range of from 1 μm and up to 50 μm. In some embodiments of the disclosure, the support layer 101 is a KAPTON® sheet. The chemical name for KAPTON® is poly (4,4'-oxydiphenylene-pyromellitimide). A polyimide film sheet or layer may also be used. Preferably the metal layer is attached to the support layer in an adhesive-less manner, to limit outgassing when used in a space environment. In some embodiments of the disclosure the support layer can have a thickness in the range of 1 mil (25.4 μm) to 4 mil (101.6 μm). In some embodiments of the disclosure, a support can be provided comprising KAPTON®, or another suitable support material, on both sides of the metal film 102, with cut-outs for the attachment of solar cells and interconnects to the metal film. In some embodiments of the disclosure, the metal film layer 103 at the bottom surface of the support is of the same material and has the same or a similar thickness as the metal film layer 102 at the top surface of the support. In some embodiments, the two metal film layers are of different materials and/or have different thicknesses.

Although the support 100 is depicted in FIG. 1 as the size and shape of the ultimate module, which may be a square or rectangular element ranging from 1 inch to 6 inches on a side, the support 100 may be fabricated out of a roll or larger support material such as a polymide film which is automatically processed and cut to produce the individual support 100 depicted in FIG. 1, or subsequently depicted processed structures in FIG. 2 through 4. A description of such fabrication processes goes beyond the scope of the present disclosure.

Figure 2A:
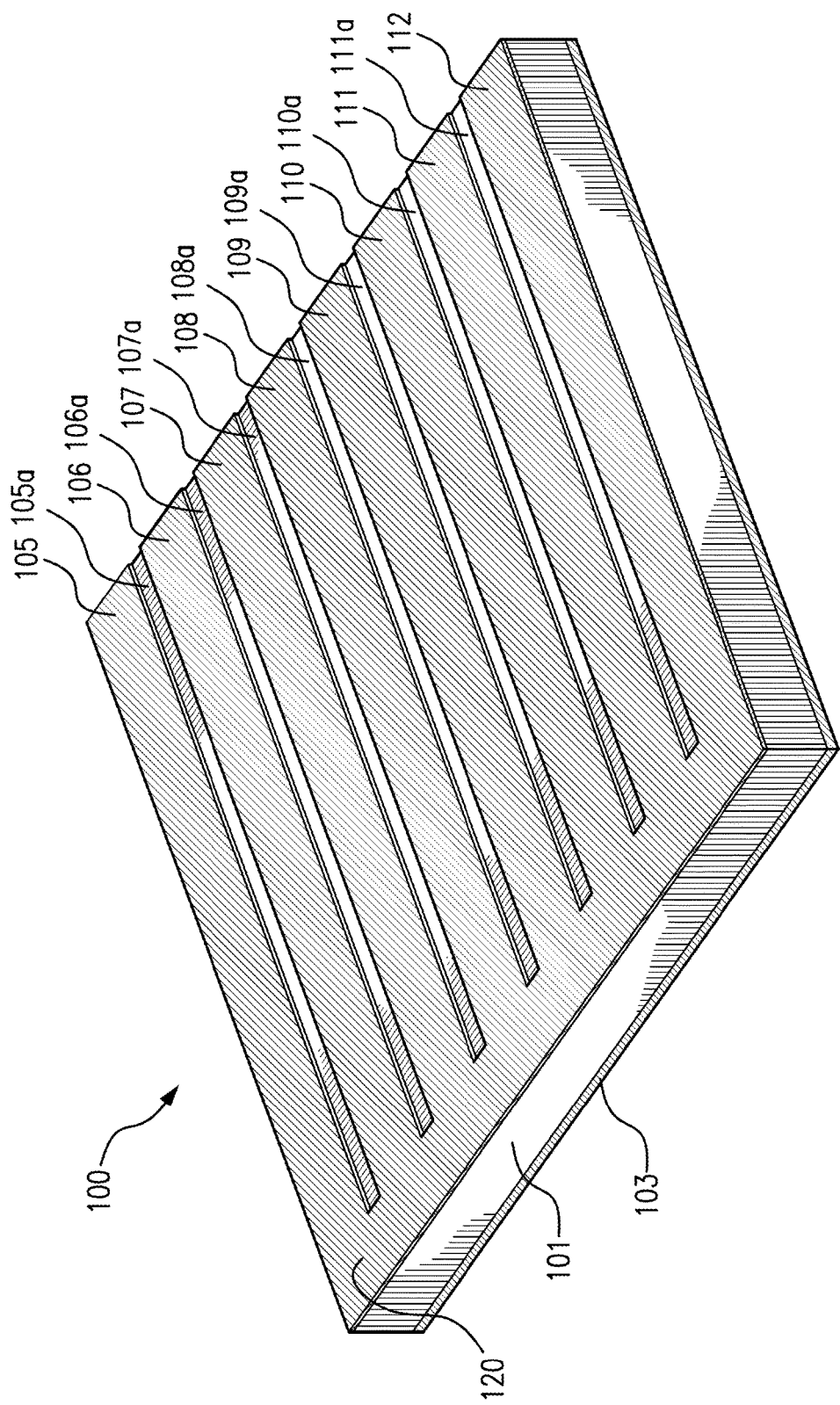
FIG. 2A is a perspective view of the support of FIG. 1 after a step of forming a plurality of grooves in a top metal layer of the support in a first embodiment.

FIG. 2A is a perspective view of the support 100 of FIG. 1 after a step of forming a plurality of grooves in a top metal layer of the support in a first embodiment. FIG. 2A illustrates the support 100 of FIG. 1 after a step in which a portion of the metal layer 102 has been removed, by for example etching or laser scribing, whereby channels or grooves 105a, 106a, . . . 111a are formed traversing the metal layer 102, separating it into at least a plurality of strips 105, 106, . . . 112 extending in parallel and in some embodiments connected to each other at a terminal 120 on a perpetual edge of the support 100.

Figure 2B:
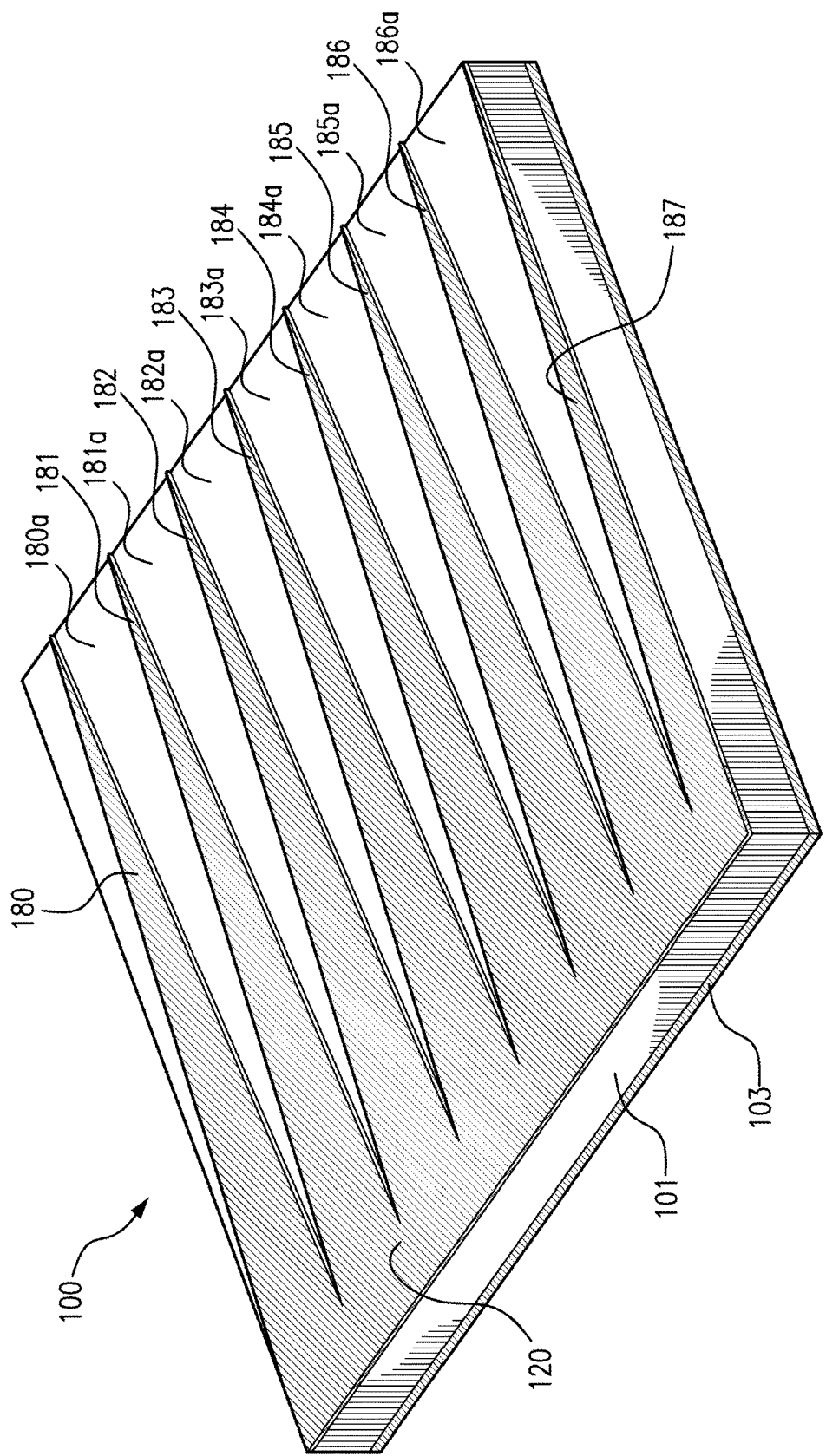
FIG. 2B is a perspective view of the support of FIG. 1 after a step of forming a plurality of grooves in the top metal layer of the support in a second embodiment.

FIG. 2B is a perspective view of the support 100 of FIG. 1 after a step of forming a plurality of grooves 180a, 181a, 182a, . . . etc. and metal strips 180, 181, . . . etc. in the top metal layer of the support in a second embodiment. Here, the grooves 180a, 181a etc. are V-shaped or triangular, and so are the strips 180, 181, . . . 187. The use of this kind of strips the width of which increases along the strip when moving from the free end of the strip to the end where the strip is connected to the band or second terminal 120, is that when in use and with solar cells arranged in a row along the strip 180, current will flow in one direction, and the current will be lowest towards the free end of the strip (where the current corresponds to the one produced by one solar cell), and higher towards the end where the strip connects to the terminal 120 (where the current is the sum of the currents produced by the solar cells arranged on the strip). Thus, the need for a sufficient cross section of conductive material is higher towards the end where the strip mates with the second terminal 120. Thus, the increasing width corresponds to an optimization of the use of conductive material, which can be important especially for space applications.

Figure 3A:
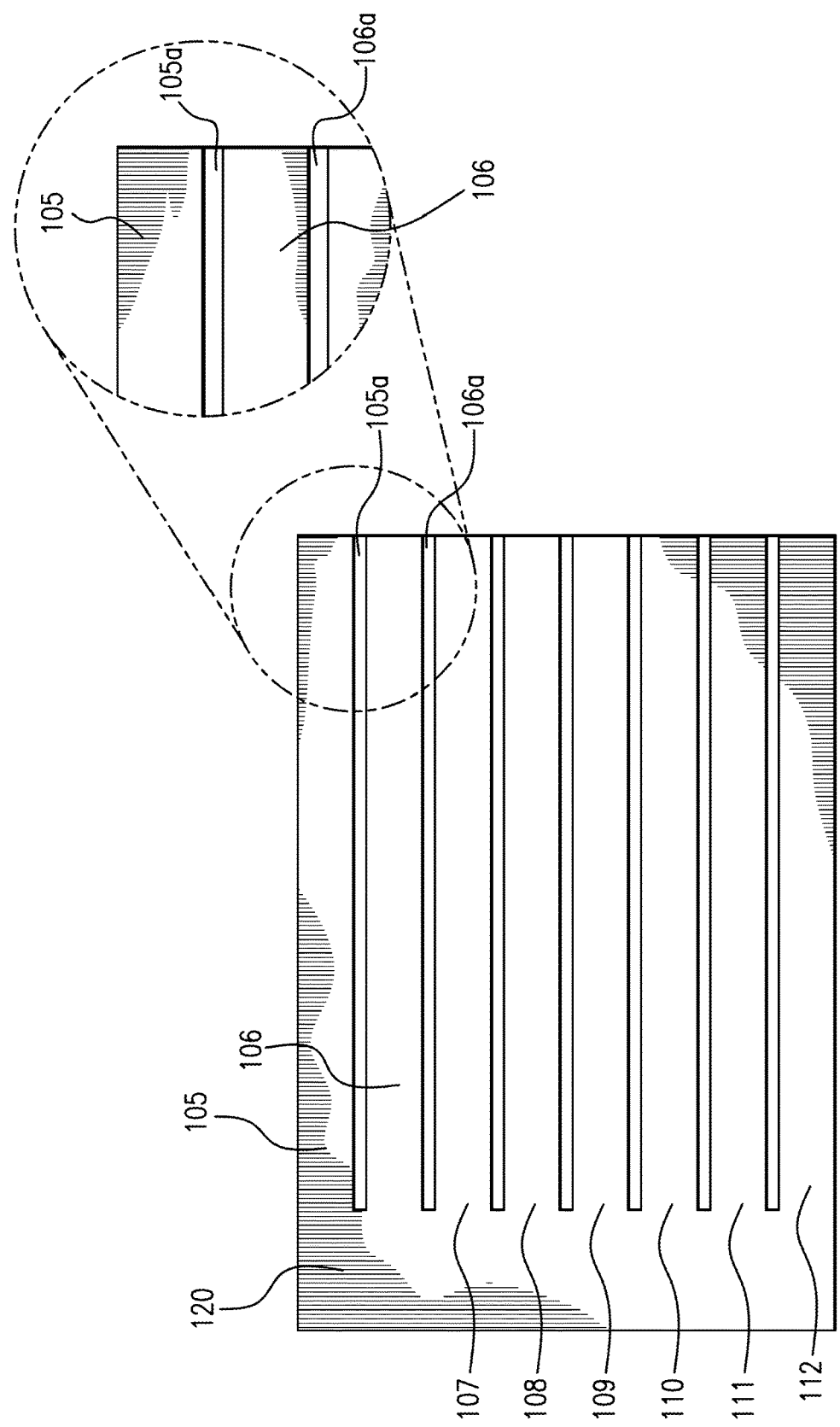
FIG. 3A is a top plan view of the support of FIG. 2A in a first embodiment.

FIG. 3A is a top plan view of the support 100 of FIG. 2A in a first embodiment with strips 105, 106, . . . 112 extending along the top surface.

Figure 3B:
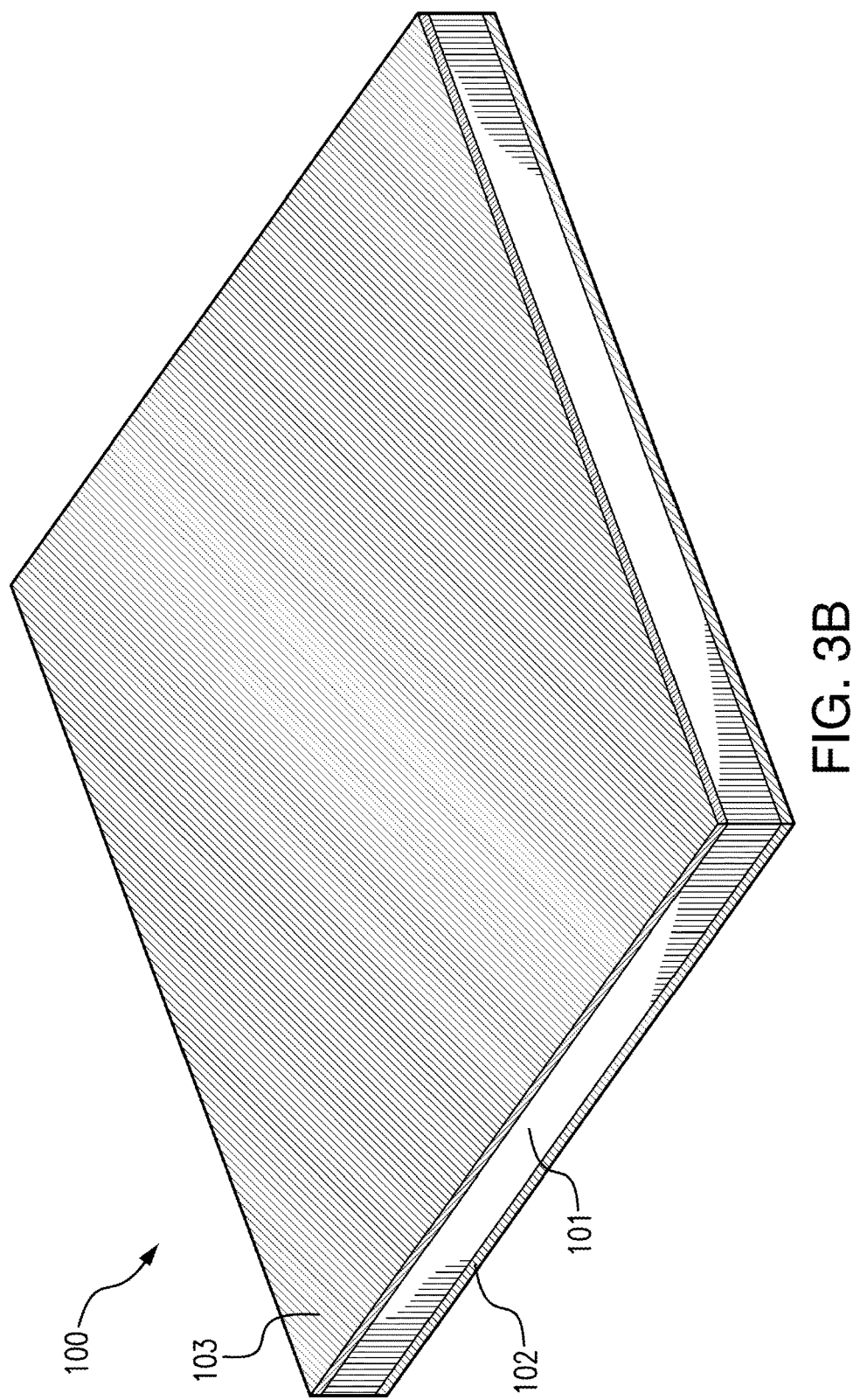
FIG. 3B is a bottom perspective view of the support of FIG. 2A in a first embodiment.

FIG. 3B is a bottom plan view of the support 100 of FIG. 2A in a first embodiment. Here, the bottom metal layer 103 completely covers the bottom surface of the support 100.

Figure 3C:
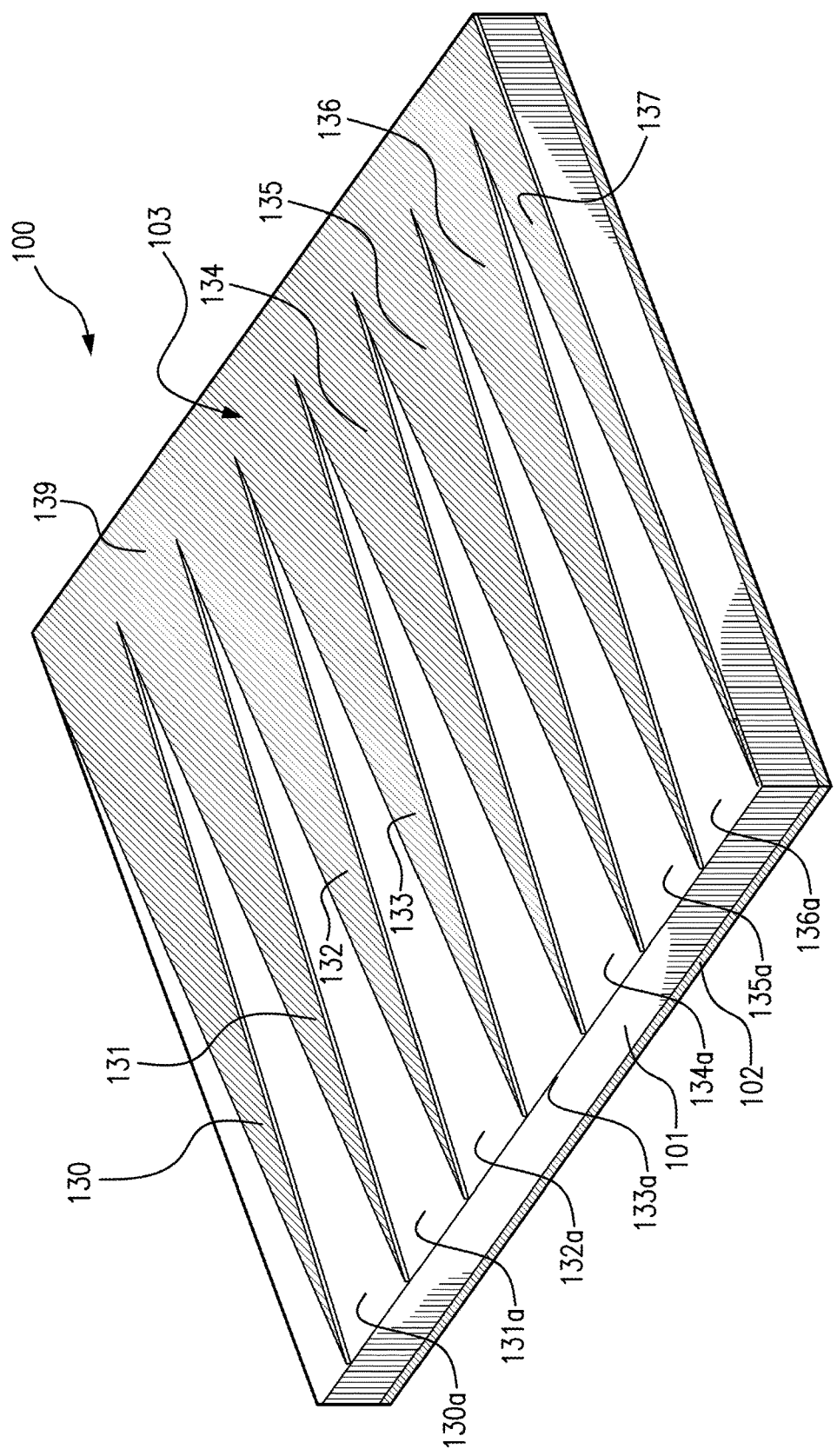
FIG. 3C is a bottom perspective view of the support of FIG. 2A in a second embodiment.

FIG. 3C is a bottom plan view of the support of FIG. 2A in a second embodiment. Here, triangular grooves 130a, 131a, . . . 136a have been established, separating triangular strips 130, 131, . . . 137. The width of the strips increases towards the end where the strips are connected to the first terminal 139. The advantages involved with this are analogous to the ones described above in relation to the V-shaped strips at the top surface in the embodiment shown in FIG. 2B.

Figure 4A:
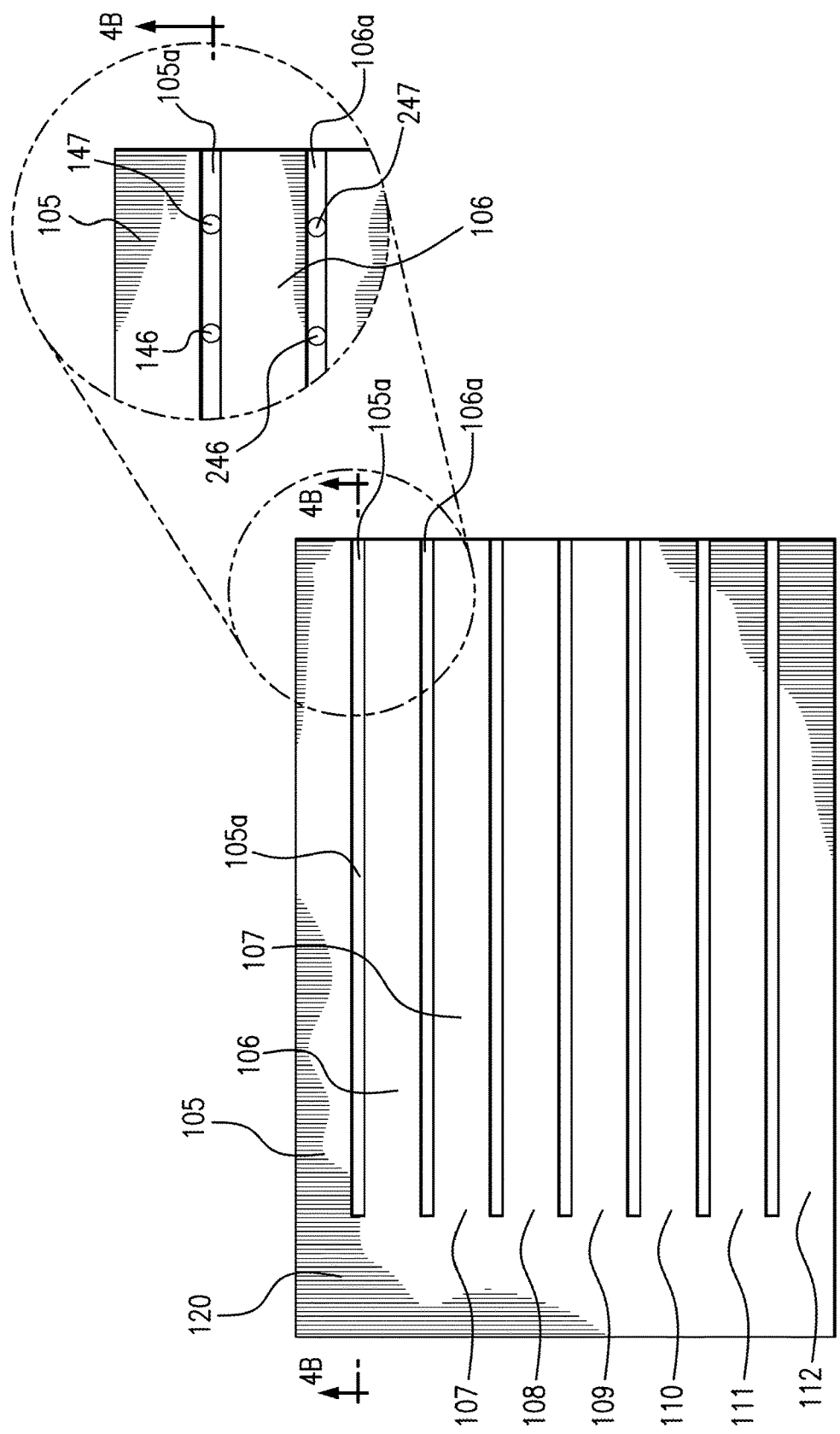
FIG. 4A is a top plan view of the support of FIG. 3A after the next process step of providing vias extending into or through the support according to the present disclosure.

FIG. 4A is a top plan view of the support of FIG. 3A after the next process step of providing vias 146, 147 along groove 105a, and vias 246, 277 along groove 106a, etc. extending into or through the support 100 according to the present disclosure. The vias can be provided using any suitable means and in one embodiment may be provided in layer 101 prior to metallization of the layers 102, 103.

FIG. 4B is a cross-sectional view of the support of FIG. 4A through the 4B-4B plane in FIG. 4A and illustrates in the first embodiment how the vias 140, 141, ... 147 traverse the support 101 and the metal film layer 103 on the bottom of the support 101.

Figure 4C:
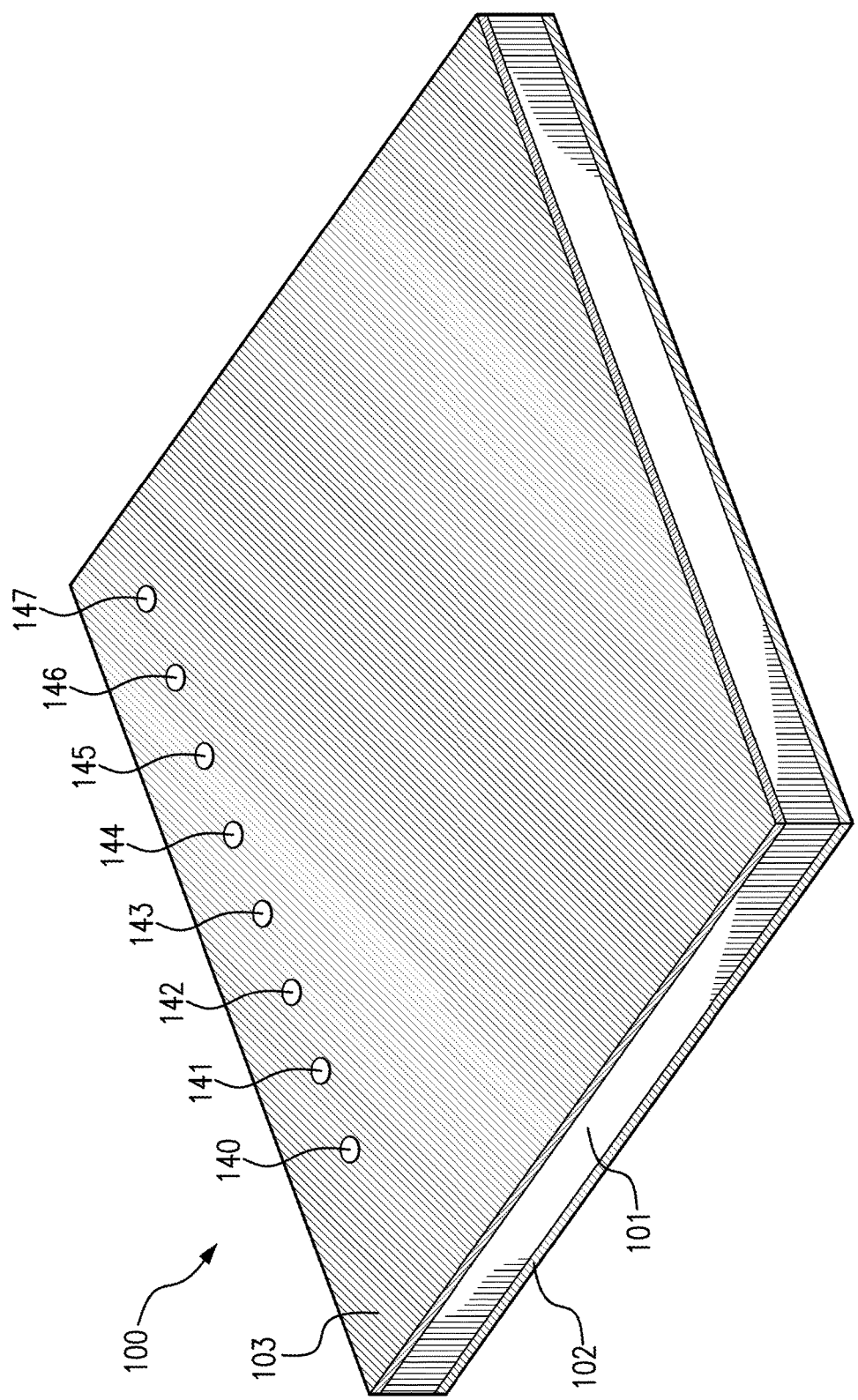
FIG. 4C is a bottom perspective view of the support of FIG. 4A in first embodiment.

FIG. 4C is a bottom plan view of the support of FIG. 4A in first embodiment and illustrates how the vias 140, 141, ... 147 traverse the metal film layer 103 and emerge at the bottom surface thereof. (Only one row of vias 140, ... 147 are shown for simplicity).

Figure 4D:
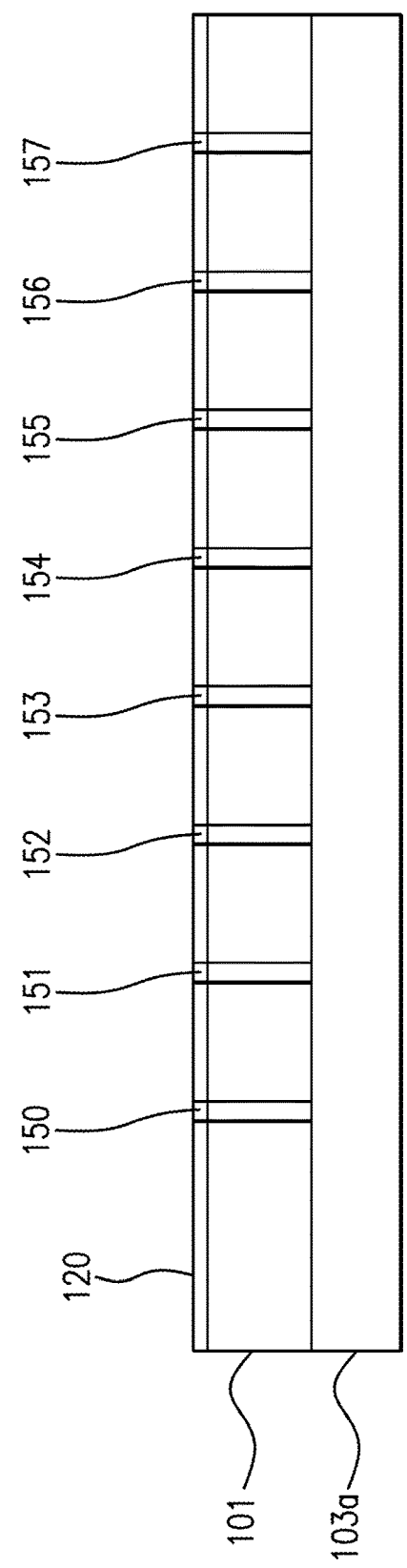
FIG. 4D is a cross-sectional view of the support according to the present disclosure in a second embodiment.

FIG. 4D is a cross-sectional view of the support of FIG. 4A according to the present disclosure in a second embodiment in which the vias 140, 141, ... 147 traverse the support 101 and stop at the top of the metal film layer which we designate in this embodiment by 103a. In this second embodiment, the metal film layer is designated as 103a to distinguish it from the metal film layer 103 of the first embodiment.

Figure 4E:
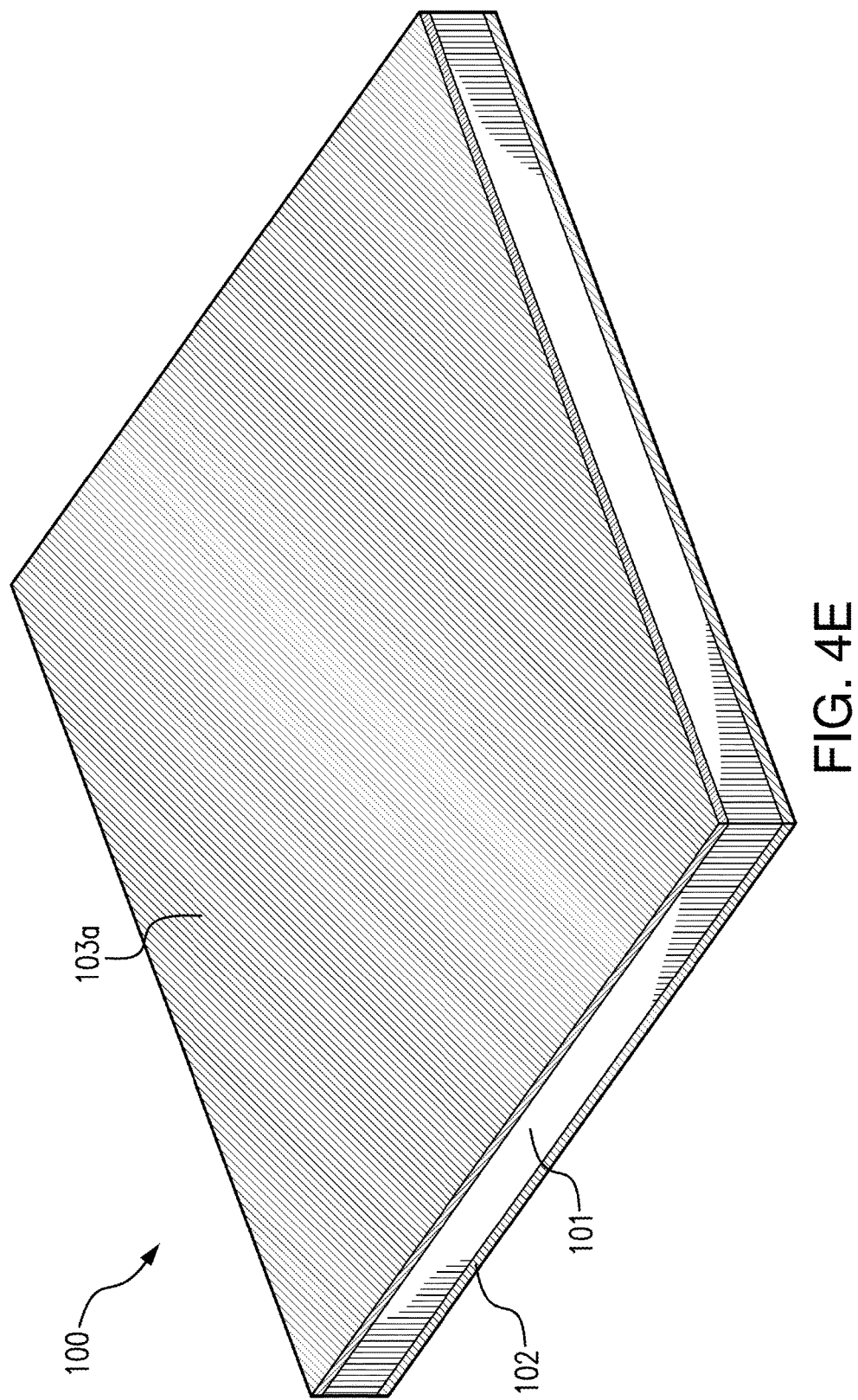
FIG. 4E is a bottom perspective view of the support of FIG. 4D in a second embodiment.

FIG. 4E is a bottom perspective view of the support of FIG. 4D in the second embodiment depicting the metal film layer 103a covering the entire bottom surface.

Figure 4F:
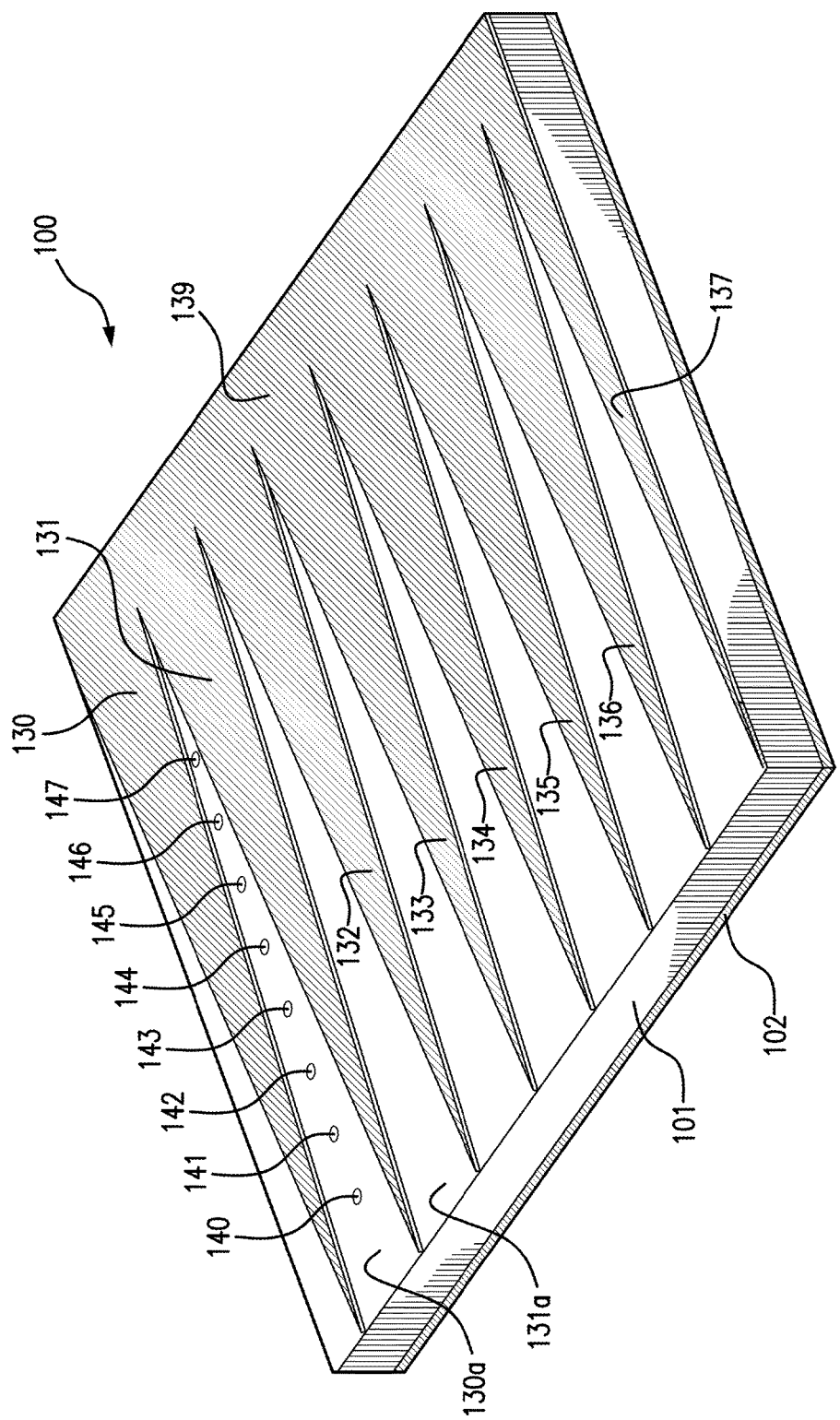
FIG. 4F is a bottom perspective view of the support of FIG. 4A in a second embodiment.

FIG. 4F is a bottom plan view of the support of FIG. 4A is a variation of the embodiment of FIG. 4C, but here the metal film layer 103 is formed into triangular strips 130, 131, ... 137. Here, the vias 140, 141, ... 147 are arranged in the grooves 130a, 131a, etc.

Figure 4G:
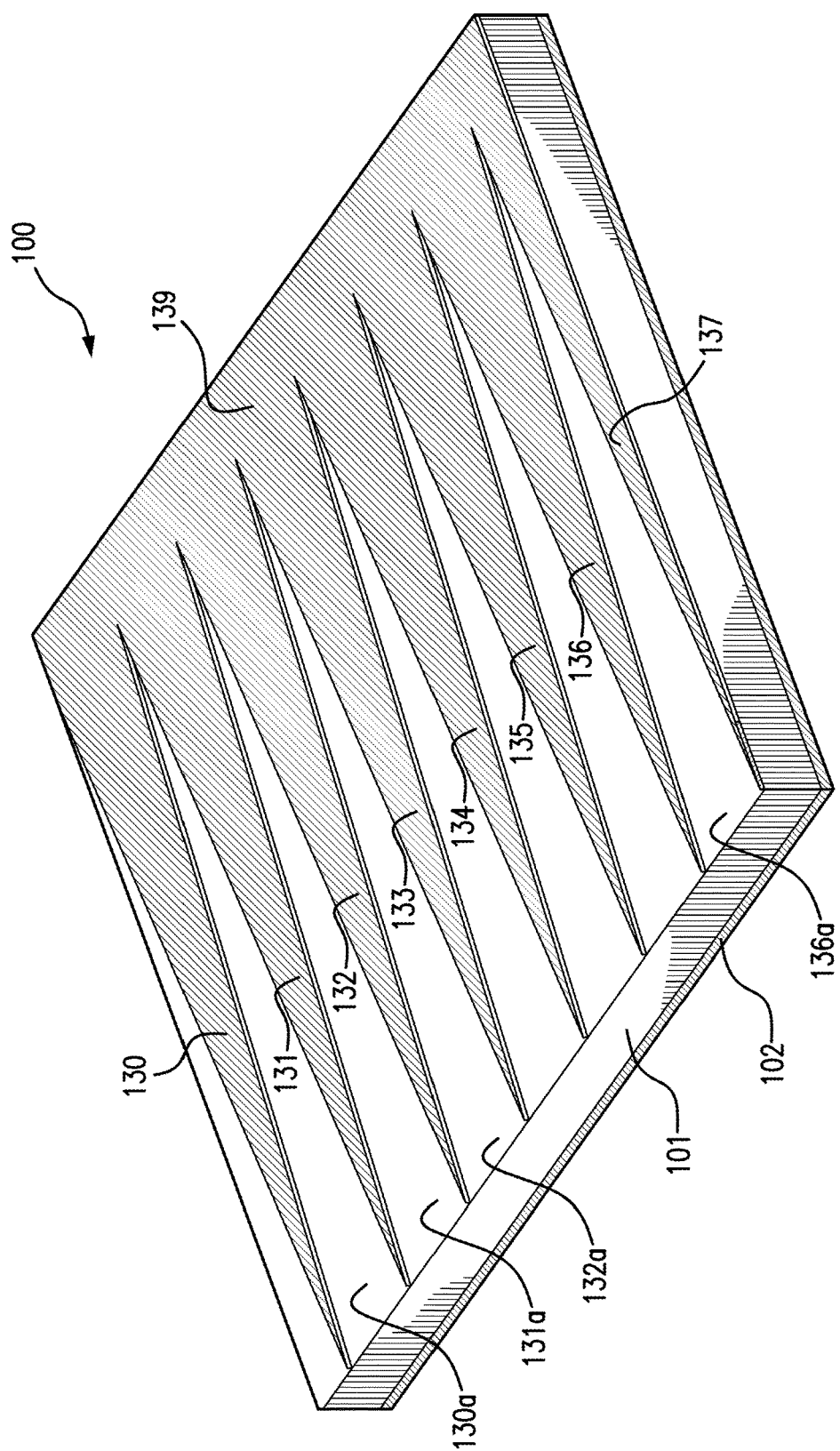
FIG. 4G is a bottom perspective view of the support of FIG. 4A in a second embodiment.

FIG. 4G is a bottom perspective view of the support of FIG. 4A in a second embodiment as a variation of the embodiment of FIG. 4E in which the vias 140, 141, ... 147 traverse the support 101 and stop at the top of the metal film layer 103a, at strips 130, 131, ... 137.

Figure 5A:
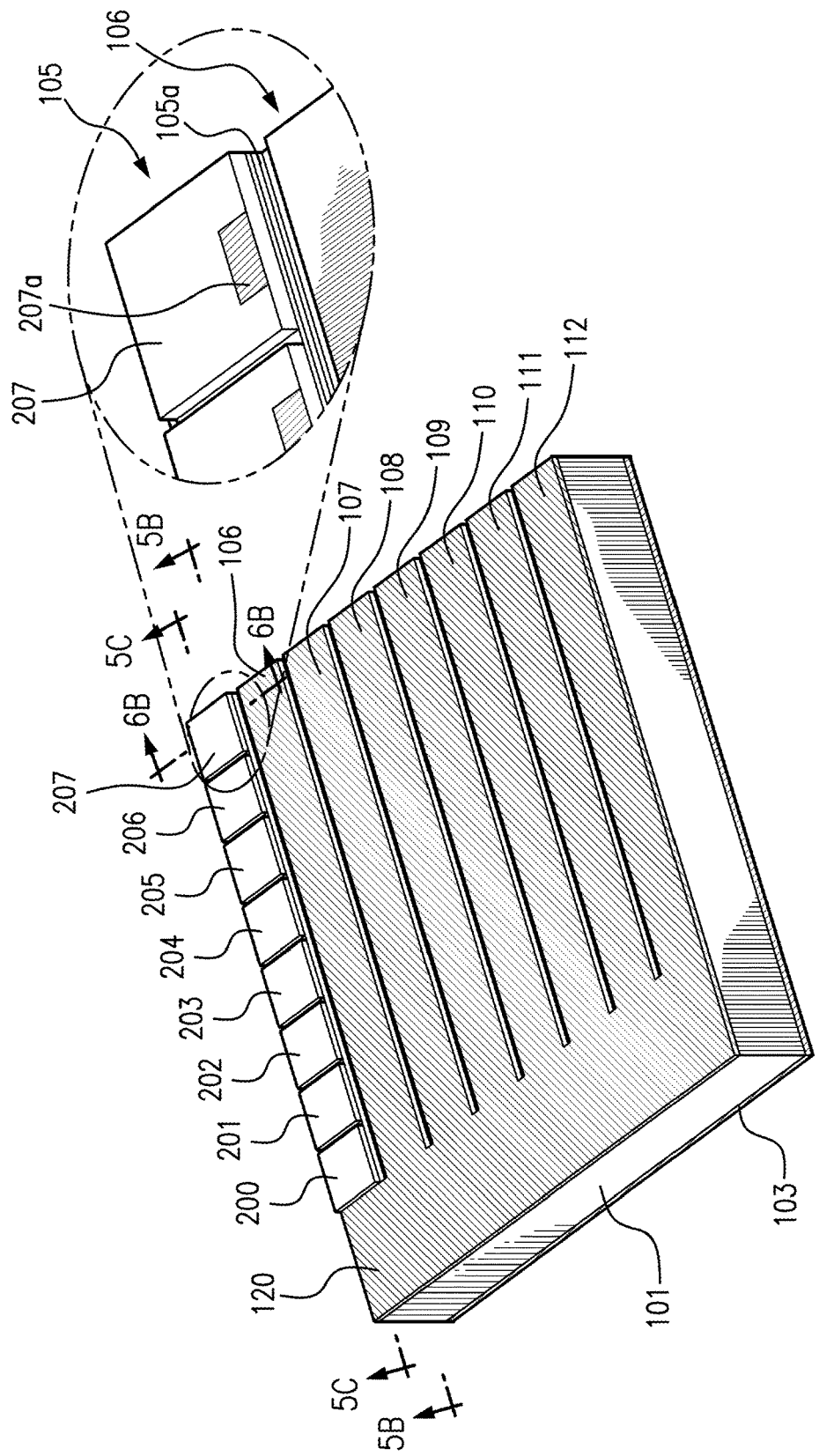
FIG. 5A is a perspective view of the support of FIG. 4A after the next process step of mounting a plurality of solar cells on the first strip according to the present disclosure.
Figure 5B:
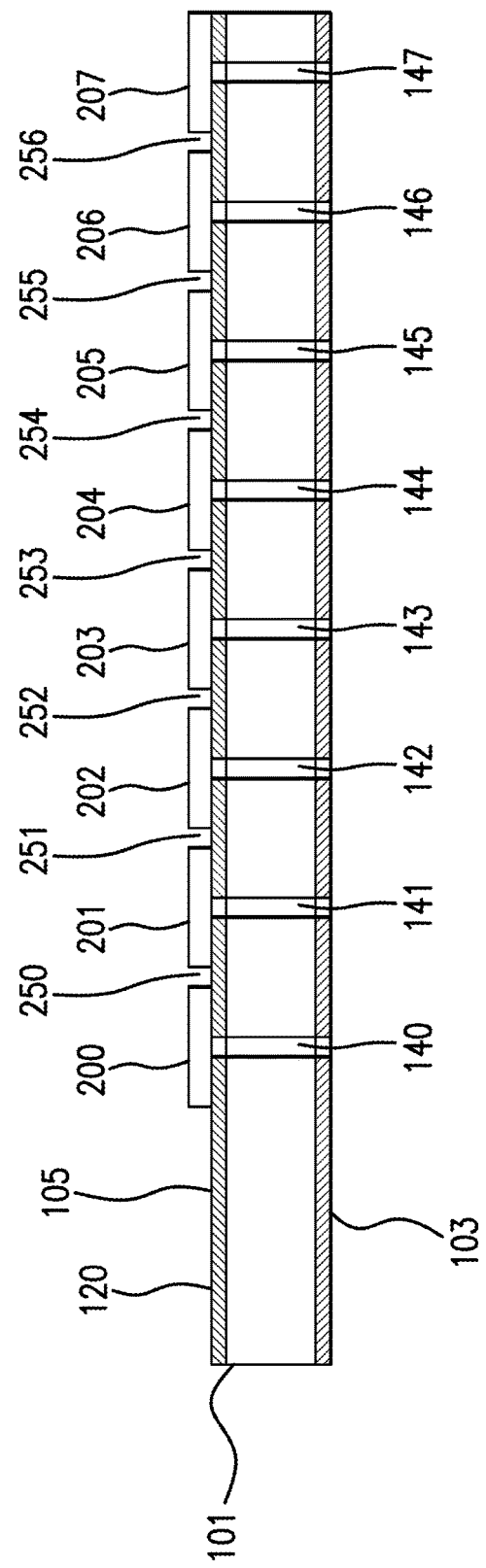
FIG. 5B is a cross-sectional view of the support of FIG. 5A through the 5B-5B plane shown in FIG. 5A.
Figure 5C:
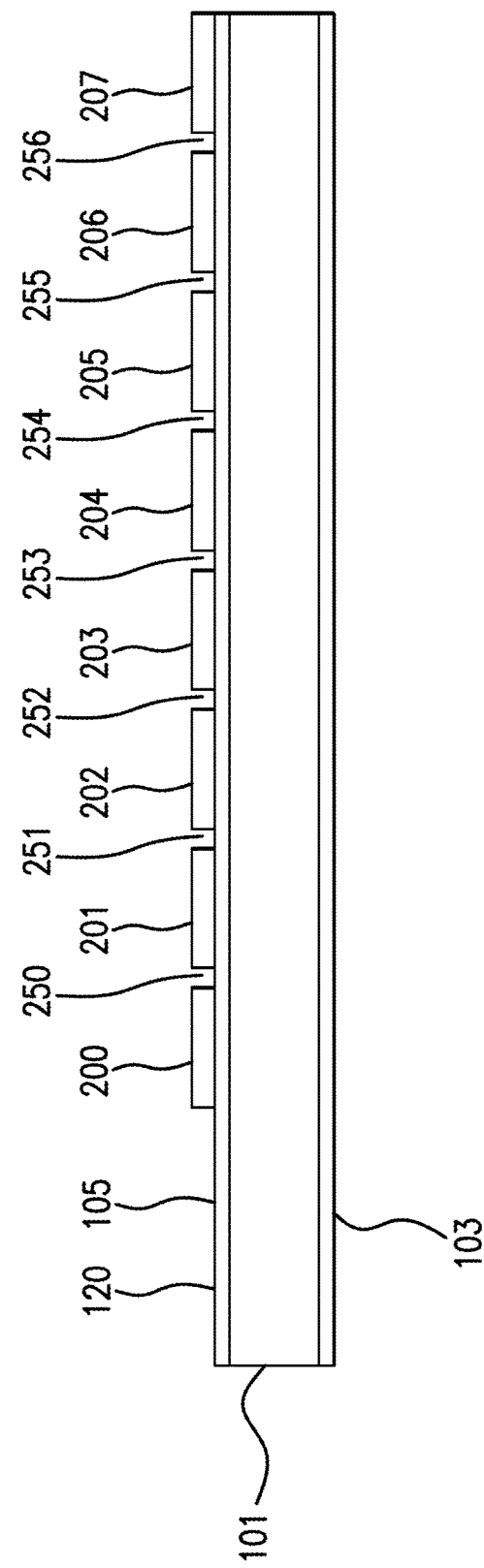
FIG. 5C is a cross-sectional view of the support of FIG. 5A through the 5C-5C plane shown in FIG. 5A.

FIG. 5A is a perspective view of the support of FIG. 4A after the next process step of mounting a plurality of solar cells 200, 201, ... 207 on a first one 105 of the strips according to the present disclosure. Each solar cell has a top surface in which a contact pad (in the enlarged depiction represented by 207a for solar cell 207), such as a cathode contact pad, is provided. FIG. 5A schematically illustrates how a plurality of solar cells 200, 201 ... etc. have been electrically connected to one of the strips forming part of the first conductive portion. The solar cells 200, 201, ... 207 are preferably placed close to each other (from 0.1 to 1 mm apart or other suitable spacing that may be possible using standard "pick-and-place" fabrication equipment) and all throughout the strips, so as to optimize space utilization. In FIGS. 5B and 5C the solar cells are shown separated by a small gap or space 250, 251, ... etc. It is preferred that a substantial percentage, such as more than 50%, 60%, 70%, 80% or 90%, such as more than 95%, of the top surface support 101 is covered by solar cells, so as to provide an optimized W/m² or W/kg ratio. However, a portion of the top metal layer, such as the terminal 120 extending along a peripheral edge of the support, can be left free of solar cells, and serve to establish direct series or parallel connection with an adjacent solar cell assembly or module.

Figure 6A:
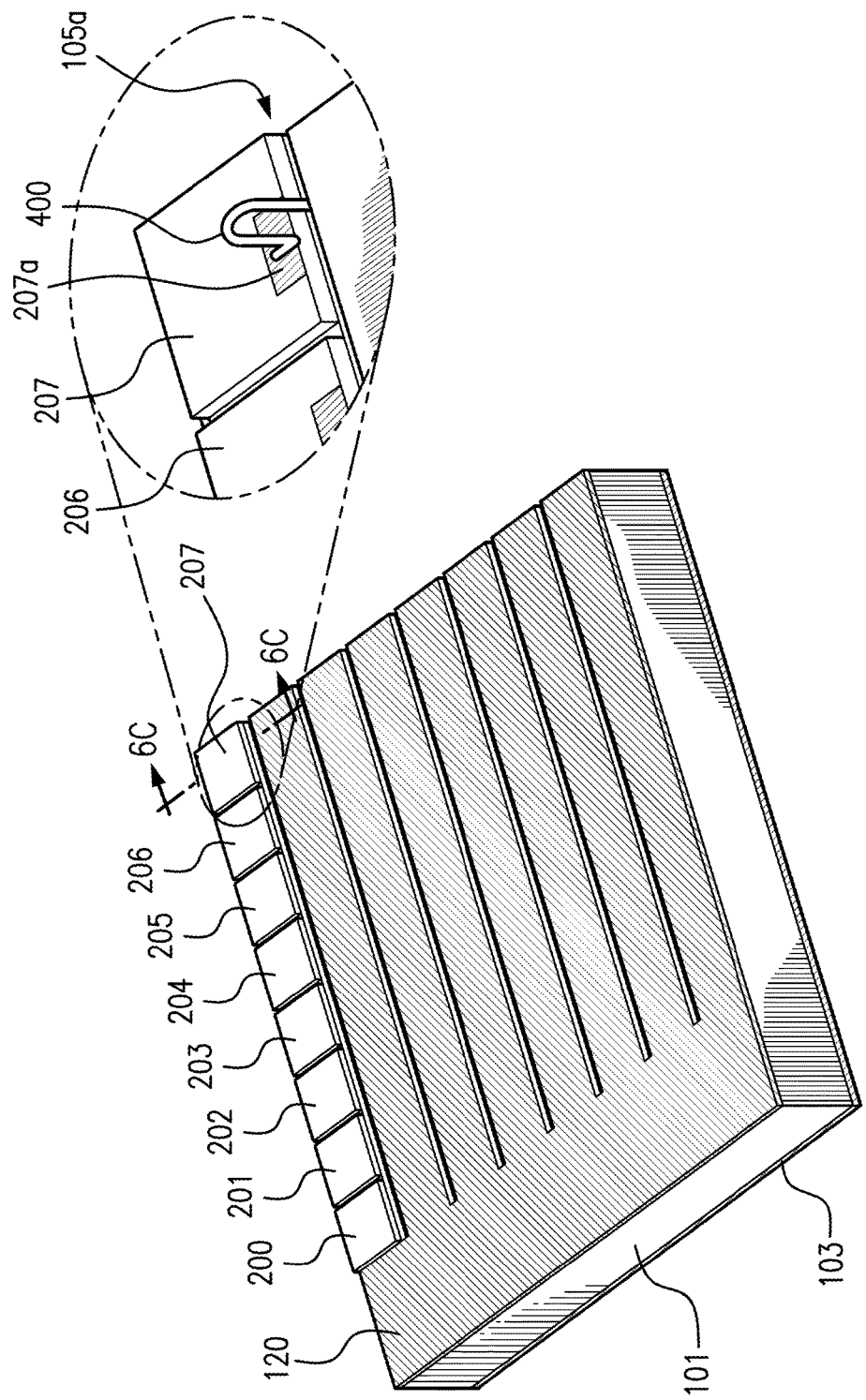
FIG. 6A is a perspective view of the support of FIG. 5A after the next process step of attaching an interconnect to each of the plurality of solar cells and passing each interconnect through an adjoining respective via according to the present disclosure.
Figure 6B:
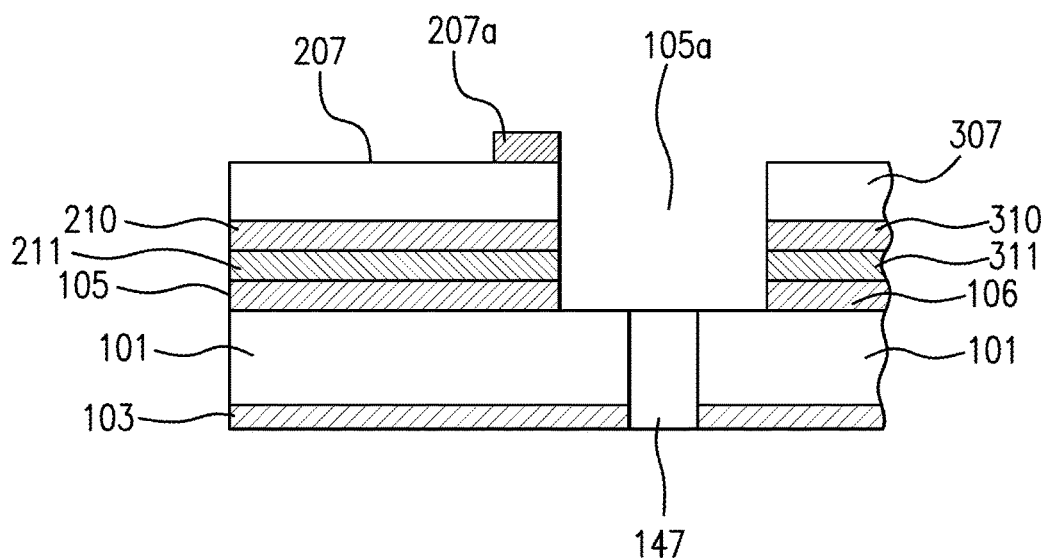
FIG. 6B is a cross-sectional view of the support of FIG. 5A through the 6B-6B plane shown in FIG. 5A in a first embodiment.

Each solar cell 200, 201, ... etc. comprises a bottom contact 210 on a rear or bottom surface of the solar cell, as shown in FIG. 6B for solar cell 207, and a top contact 207a on a front or top surface of the solar cell 207. In some embodiments of the disclosure, the bottom contact 210 comprises a metal layer covering the entire rear surface of the solar cell or a substantial portion of the rear surface of the solar cell, and the top contact 207a is a small pad placed adjacent to an edge of the front surface of the solar cell 207. The top contact 207a has preferably a small surface area to allow the major part of the front surface of the solar cell to be an effective surface for the conversion of sunlight into electric power. In the enlarged portion of FIG. 5A, the top contact 207a is only shown for one of the solar cells 207, for simplicity.

The solar cell 207 is preferably attached to the metal strip 105 by a conductive bonding material 211 as shown in FIG. 6B, such as a layer of a metal alloy, such as an indium alloy, such as an indium lead alloy. As is easily understood from FIG. 6B and FIG. 6C, the metal layer including the strip 105 serves as a heat sink for the solar cells, and an indium alloy such as indium lead has appropriate heat conduction characteristics. At the same time, indium is advantageous as it provides for ductility, thereby reducing the risk for cracks in the bonds between the solar cells and the metal strip 105 when the assembly is subjected to the bending forces.

FIG. 5B is a cross-sectional view of the support of FIG. 5A through the 5B-5B plane shown in FIG. 5A.

FIG. 5C is a cross-sectional view of the support of FIG. 5A through the 5C-5C plane shown in FIG. 5A.

Figure 5D:
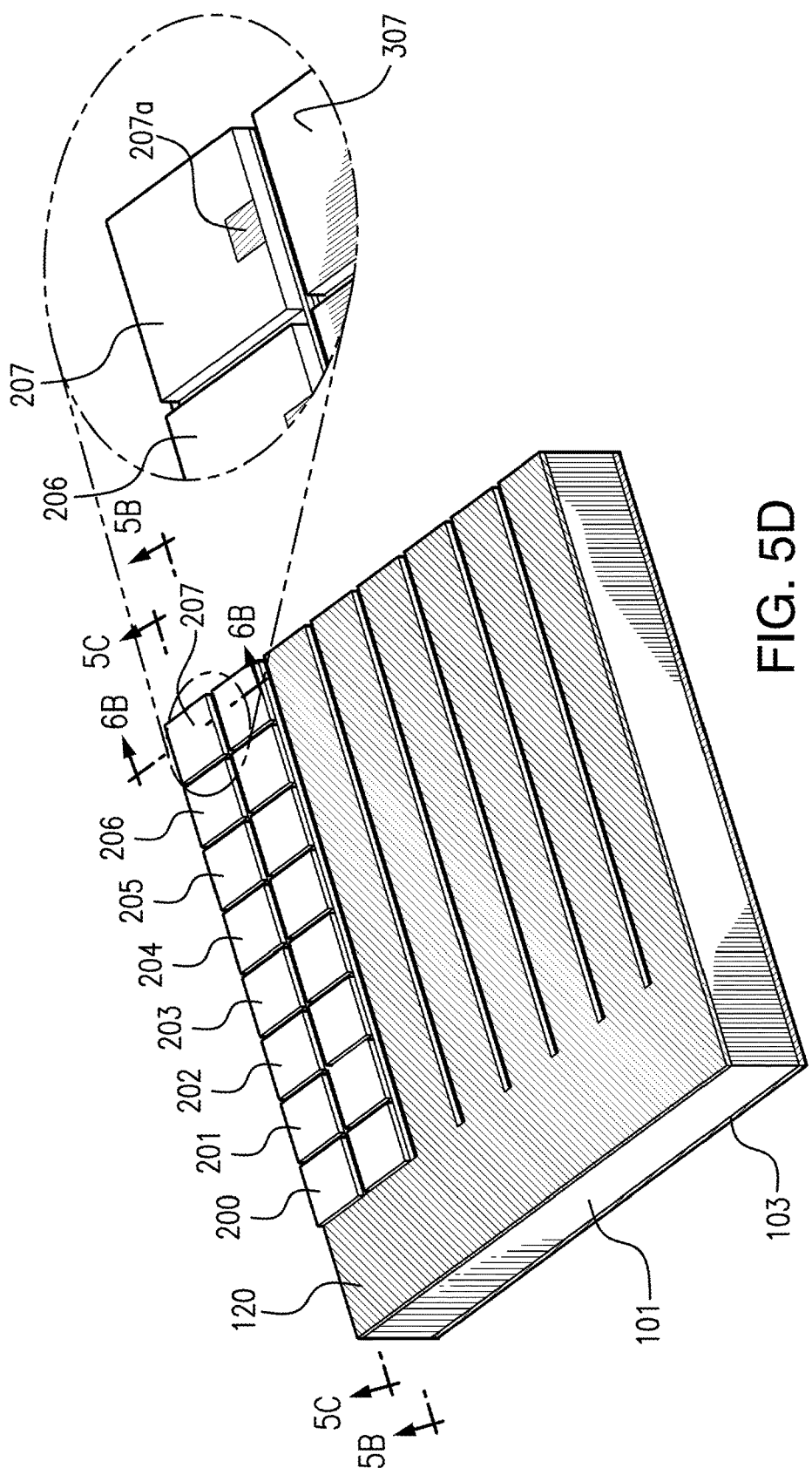
FIG. 5D is a perspective view of the support of FIG. 4A after the next process step according to the present disclosure of mounting a plurality of solar cells on the second strip.

FIG. 5D is a perspective view of the support of FIG. 4A after the next process step according to the present disclosure of mounting a plurality of solar cells 300, ... 307 on the second strip 106. The complete population of all strips 105, 106, ... 112 with solar cells is not shown for simplicity of the drawing.

FIG. 6A is a perspective view of the support of FIG. 5A after the next process step of attaching an interconnect 400 to each of the plurality of solar cells and passing each interconnect through an adjoining respective via according to the present disclosure. In this embodiment, the interconnect is a simple wire 400. Wire bonding can be used to attach the wire to the contact pad at the top surface of the solar cell, using standard wire bonding techniques and standard automation equipment for wire bonding.

FIG. 6B which has already been discussed above is a cross-sectional view of the support of FIG. 6A through the 6B-6B plane shown in FIG. 5A, and shows the corresponding part of the assembly prior to incorporation of the wire including the channel 105a shown in FIG. 2A and the via 147.

Figure 6C:
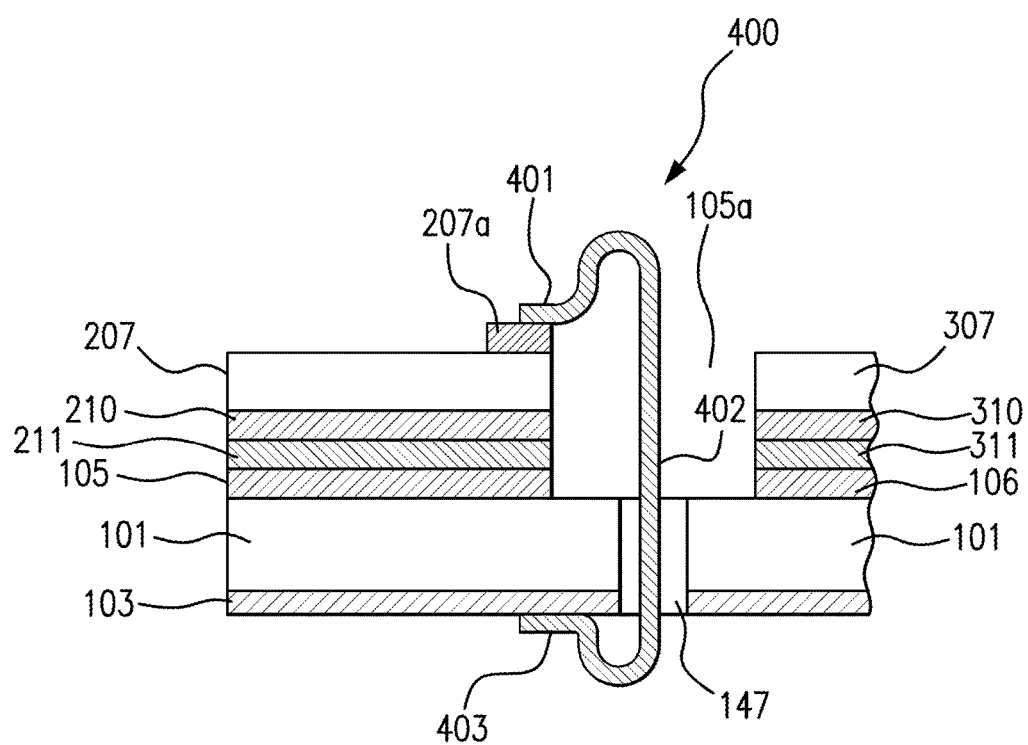
FIG. 6C is a cross-sectional view of the support of FIG. 6A through the 6C-6C plane shown in FIG. 6A depicting the interconnect arrangement in the first embodiment according to the present disclosure.

FIG. 6C is a cross-sectional view of the support of FIG. 6A through the 6C-6C plane shown in FIG. 6A and illustrates the same part of the assembly after incorporation of the wire 400 in a first embodiment. Here, it can be seen how the wire 400 interconnects the contact pad 201 and the metal layer 103 on the bottom surface of the support. A first end 401 of the wire is wire bonded to the contact pad 207a, and a second end 403 of the wire is wire bonded to the bottom surface of the metal layer 103, and the first end 401 and the second end 403 are interconnected by a portion 402 of the wire that extends through the via 147.

Figure 6D:
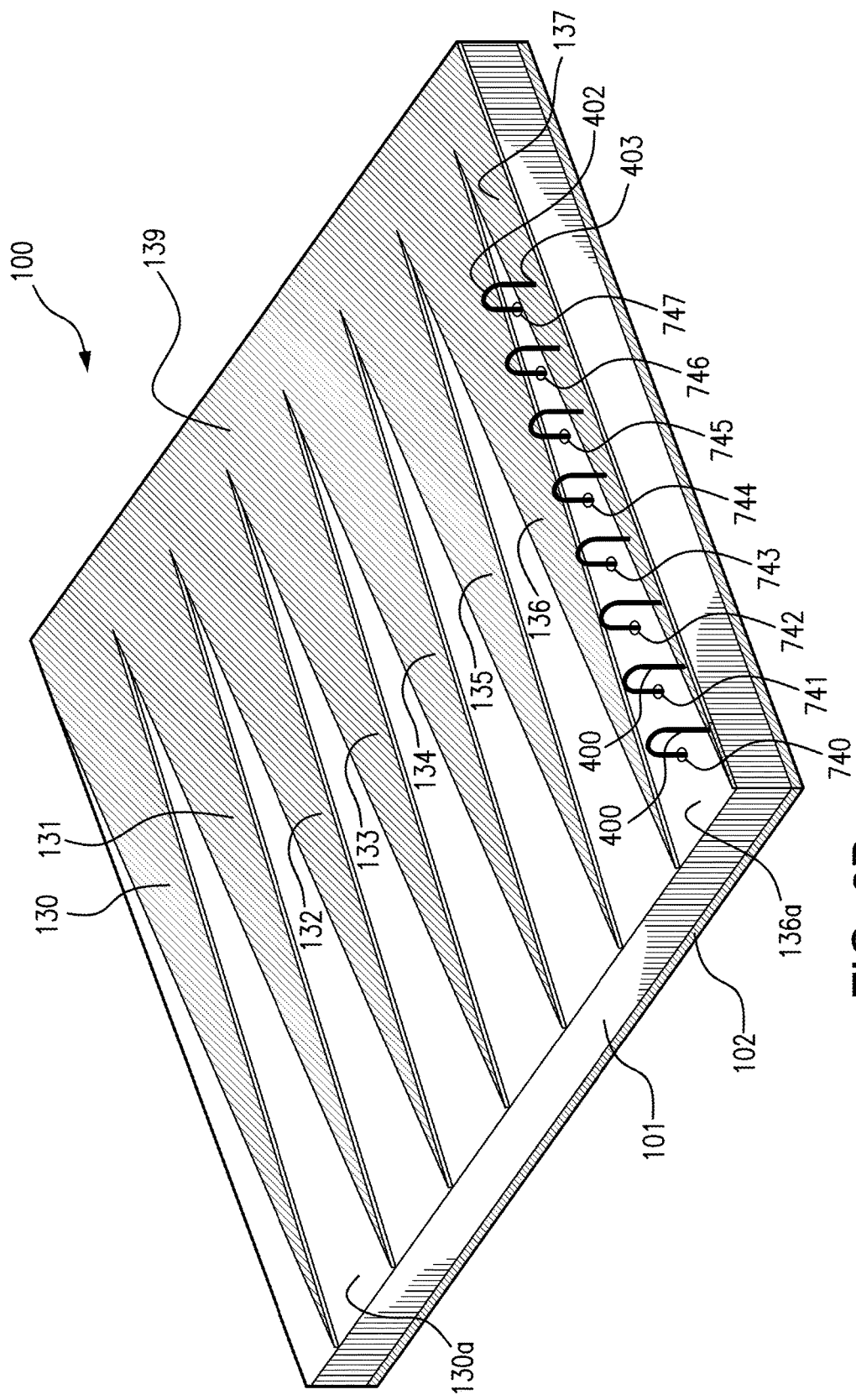
FIG. 6D is a bottom view of the support of FIG. 6A in which the interconnect extending through a respective via is electrically connected to a portion of the metallization layer on the back surface.

FIG. 6D is a bottom view of the support of FIG. 6A in which the interconnects 400 extending through a respective via 740, ... 747 along the groove 137a is electrically connected to a portion, namely, to a triangular strip 137 of the metallization layer 103 on the back surface. It should be observed that FIGS. 6A-6D are purely schematic and that in practice, in other embodiments the interconnects 400 may not protrude beyond the bottom surface of the support as shown in FIG. 6D, as will be presented in FIGS. 6F and 6G below.

Figure 6E:
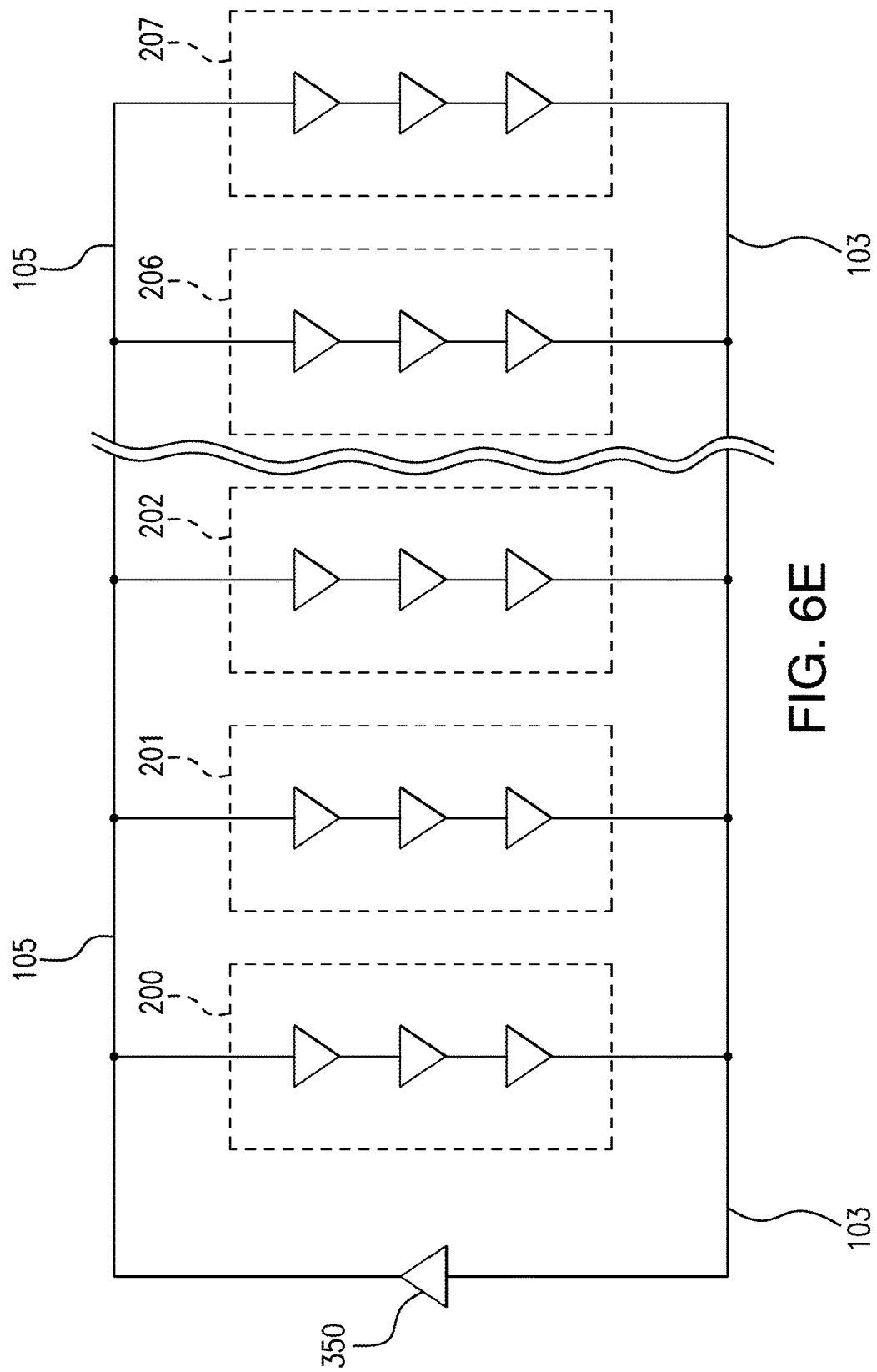
FIG. 6E is a schematic diagram of the components of the module of FIG. 6A.

FIG. 6E is a schematic diagram of the components of the first row of solar cells 200, . . . 207 in the module of FIG. 6A, and shows how a plurality of such solar cells are connected in parallel due to their connection to the top conductive layer 102 and the bottom conductive layer 103. In addition, a bypass diode 350 is connected in parallel with the row of solar cells, also by connection to the top conductive layer 102 and the bottom conductive layer 103. The diode 350 can be physically implemented on any of the two sides of the support. For example, in some embodiments, the bypass diode can be placed on the same side of the support as the solar cells, for example, adjoining one or more of the solar cells 200 shown in FIG. 6A. In other embodiments, the diode can be implemented on the bottom side of the support. Depictions of the diode 350 are not shown in the other figures for simplicity of the drawings.

Figure 6F:
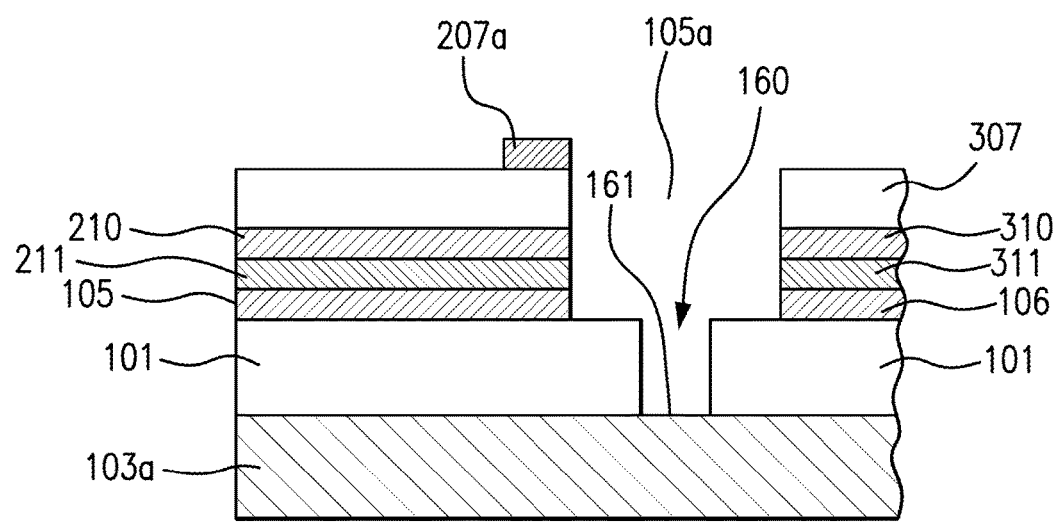
FIG. 6F is a cross-sectional view of the support of FIG. 5A through the 6B-6B plane shown in FIG. 5A in a second embodiment according to the present disclosure.

FIG. 6F is a cross-sectional view of the support of FIG. 5A through the 6B-6B plane shown in FIG. 5A in a second embodiment according to the present disclosure.

Figure 6G:
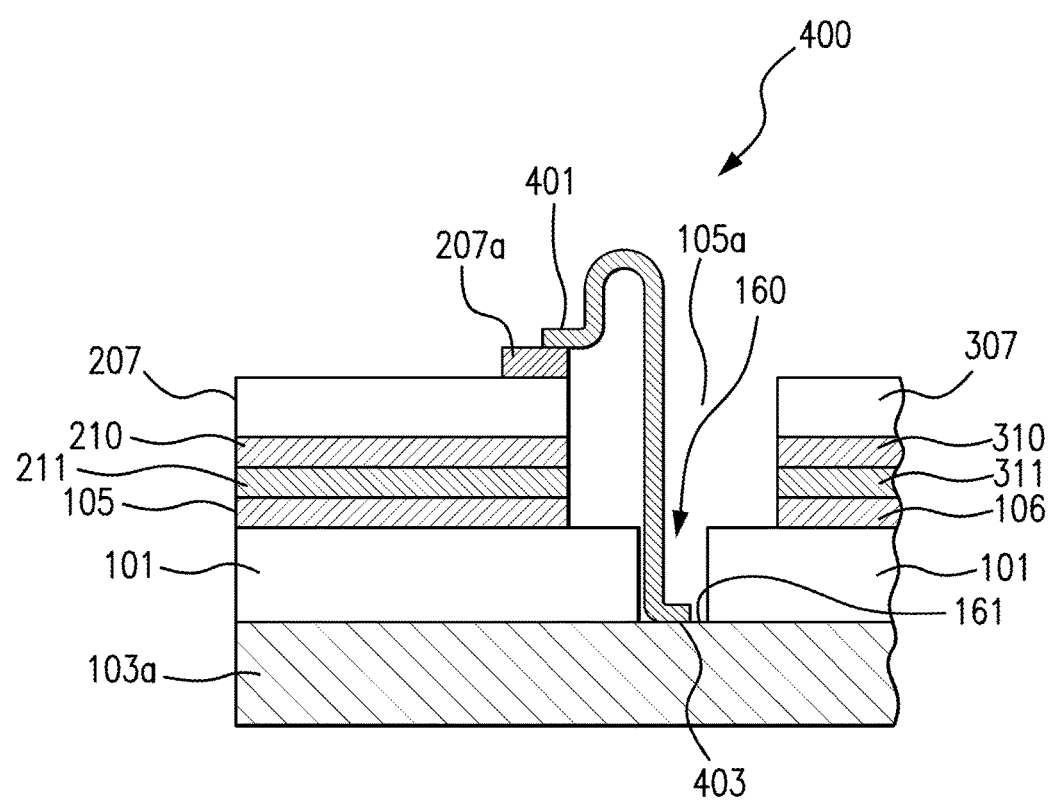
FIG. 6G is a cross-sectional view of the support of FIG. 6A depicting the interconnect arrangement in the second embodiment according to the present disclosure in which the interconnect extends through a respective via and is electrically connected to a portion of the metallization layer on the back surface at the bottom of the via.

FIG. 6G is a cross-sectional view of the support of FIG. 6A depicting the interconnect arrangement in the embodiment according to the present disclosure in which the interconnect 400 extends through a respective via 160 and is electrically connected at the end 403 of the interconnect 400 to a portion 161 of the top surface of the metallization layer 103a disposed at the bottom of the via 160.

It is clear from the embodiments schematically shown in the figures discussed above how many small solar cells, such as solar cells having a surface area of less than 1 cm$^2$, less than 0.1 cm$^2$ or less than 0.01 cm$^2$, can easily be placed on the first conductive portion such as on different subareas, tracks or strips of the first conductive portion, and bonded to it by bonding their back sides to the first conductive portion using a conductive bond that connects that bottom contact of the solar cell to the first conductive layer 102, and how interconnects 400 can be added to connect the top contacts of the solar cells to the second conductive layer 103, through vias 150 through the support. One or more bypass diodes can easily be added, as explained.

Thus, an assembly of a plurality of solar cells connected in parallel is obtained, and this kind of assembly can be used as a subassembly or module, together with more subassemblies or modules of the same kind, to form a larger assembly, such as a solar array panel, including strings of series connected assemblies.

Although a parallel electrical interconnection scheme is the specific arrangement depicted in the present disclosure, the interconnection of individual solar cells in a module by suitable arrangements or trace patterns of the conductive layers on the first and second sides of the support.

The figures are only intended to schematically show embodiments of the disclosure. In practice, the spatial distribution will mostly differ: solar cells are to be packed relatively close to each other and arranged to occupy most of the surface of the assembly, so as to contribute to an efficient space utilization from a W/m$^2$ perspective.

Figure 7A:
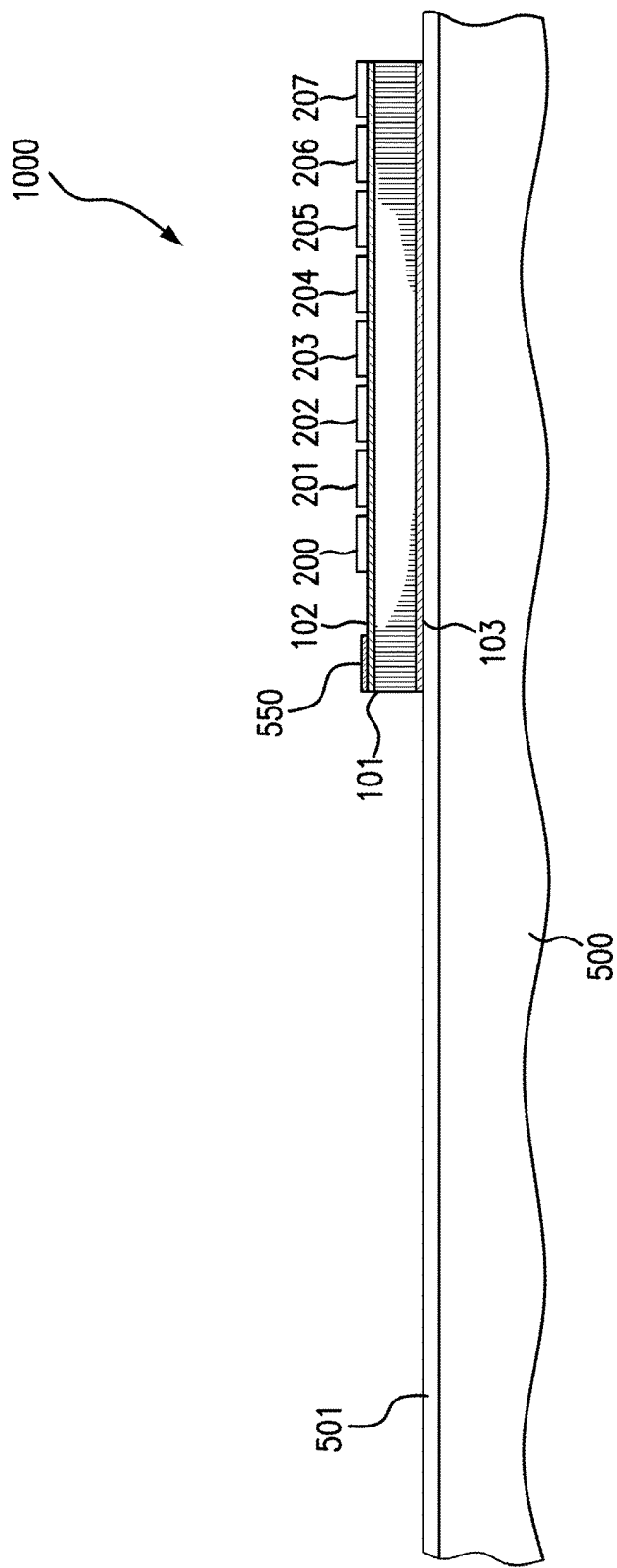
FIG. 7A is a schematic cross-sectional view of a first solar cell module of FIG. 6A mounted on a panel or supporting substrate during the first step of a panel assembly process.

FIG. 7A is a schematic cross-sectional view of a first solar cell module or assembly 1000 of the type described above, mounted on a panel or supporting substrate 500 during the first step of a panel assembly process. An adhesive layer 501 is present on the top surface of the substrate 500 for attaching the assembly 1000 to the substrate 500. A interconnection pad 550, for example, of a conductive material—such as for example an indium alloy—that can be fused to bond two conductive layers to each other, is placed adjacent to an edge of the assembly 1000, on top of the first conductive layer 102 and, more specifically, on the second terminal part of the first conductive layer.

Figure 7B:
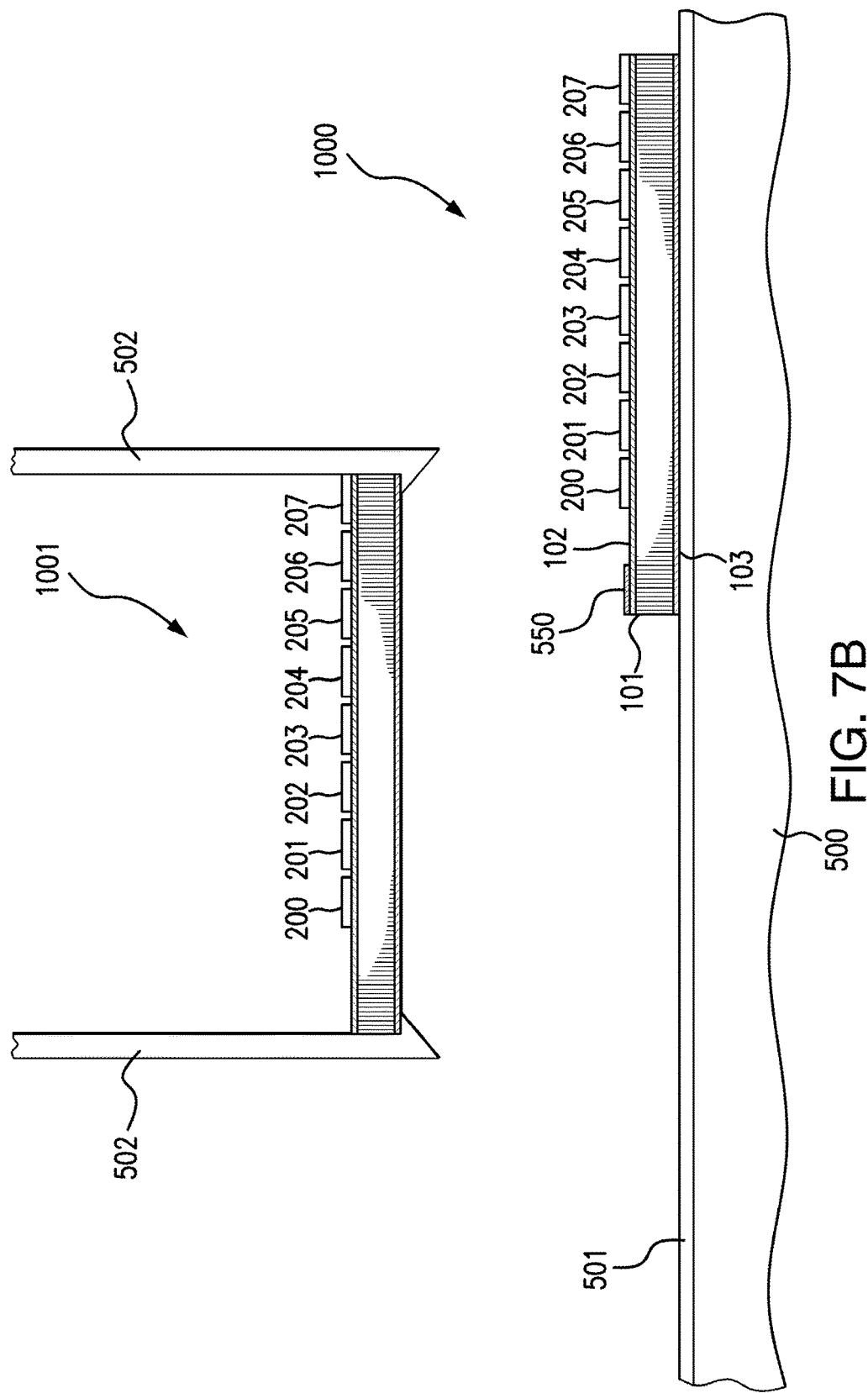
FIG. 7B is a schematic cross-sectional view of a second solar cell module of FIG. 6A positioned and about to be coupled with the first solar cell module during the second step of a panel assembly process.

FIG. 7B schematically illustrates how a second solar cell assembly 1001, of the same type as the first solar cell assembly 1000, is being transferred to a position partially overlapping with the first solar cell assembly 1000, by a schematically illustrated pick-and-place apparatus 502.

FIG. 7C schematically illustrates a third step of the process, with the second solar cell module 1001 coupled with the first solar cell module 1000. It can be seen how the second solar cell module 1001 and the first solar cell module partially overlap with each other: more specifically, the second solar cell module 1001 is placed on top of a portion of the first conductive layer 102 of the first solar cell module 1000 that is free from solar cells, that is, a portion that corresponds to the second terminal described above.

FIG. 7D schematically illustrates the first and the second solar cell modules arranged on the supporting substrate after a fourth step of a panel assembly process. Here, a major portion of the second solar cell assembly 1001 has been aligned with the first solar cell assembly 1000 and glued to the supporting substrate 500 by the adhesive layer 501. The first terminal of the second solar cell assembly 1001 has been bonded to the second terminal of the first solar cell assembly 1000.

Figure 8:
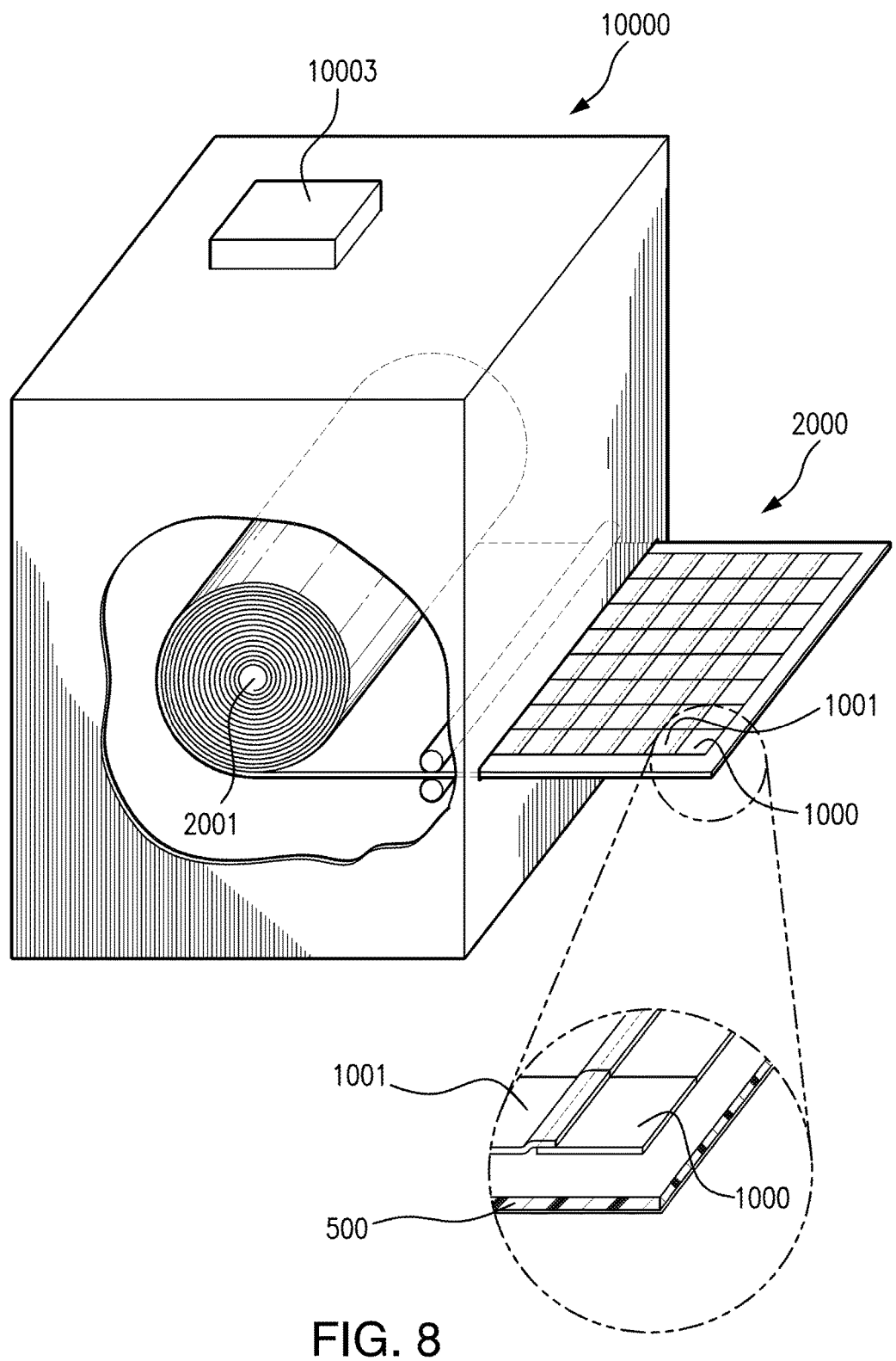
FIG. 8 is a highly simplified perspective view of a space vehicle incorporating an array in which the deployable solar cell panel incorporates the interconnected solar cell module assemblies according to the present disclosure.

FIG. 8 is a highly simplified perspective view of a space vehicle 10000 incorporating a solar cell array 2000 in the form of a deployable flexible sheet including a flexible substrate 500 on which solar cell modules 1000 and 1001 according to the present disclosure are placed. The sheet may wrap around a mandrel 2001 prior to being deployed in space. The space vehicle 10000 includes a payload 10003 which is powered by the array of solar cell assemblies 2000.

It is to be noted that the terms "front", "back", "top", "bottom", "over", "on", "under", and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Furthermore, those skilled in the art will recognize that boundaries between the above described operations are merely illustrative. The multiple units/operations may be combined into a single unit/operation, a single unit/operation may be distributed in additional units/operations, and units/operations may be operated at least partially overlapping in time. Moreover, alternative embodiments may include multiple instances of a particular unit/operation, and the order of operations may be altered in various other embodiments.

In the claims, the word 'comprising' or 'having' does not exclude the presence of other elements or steps than those listed in a claims. The terms "a" or "an", as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the claim includes the introductory phrases "one or more" or "at least one" and indefinite articles such as "a" or "an". The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The present disclosure can be embodied in various ways. The above described orders of the steps for the methods are only intended to be illustrative, and the steps of the methods of the present disclosure are not limited to the above specifically described orders unless otherwise specifically stated. Note that the embodiments of the present disclosure can be freely combined with each other without departing from the spirit and scope of the disclosure.

Although some specific embodiments of the present disclosure have been demonstrated in detail with examples, it should be understood by a person skilled in the art that the above examples are only intended to be illustrative but not to limit the scope of the present disclosure. It should be understood that the above embodiments can be modified without departing from the scope and spirit of the present disclosure which are to be defined by the attached claims.

The invention claimed is:

1. A solar cell assembly comprising:
   a flexible support layer comprising a first side and an opposing second side wherein the flexible support layer is electrically insulating;
   a first terminal disposed on the second side of the flexible support layer;
   a first electrically conductive layer disposed directly on a portion of the first side of the flexible support layer, the first electrically conductive layer comprising a second terminal and a first plurality of strips extending away from the second terminal, wherein plurality of strips are separated by a groove;
   a second electrically conductive layer disposed directly on a portion of the second side of the flexible support layer, the first terminal being connected to the second electrically conductive layer;
   a plurality of III-V compound semiconductor multijunction solar cells, organized into subsets of more than one III-V compound semiconductor multijunction solar cell and with each subset being mounted on a strip of the first plurality of strips, wherein each strip of the first plurality of strips extends beyond a periphery of the III-V compound semiconductor multijunction solar cells of the subset mounted thereon, and each III-V compound semiconductor multijunction solar cell comprising a top surface including a contact of a first polarity type, and a rear surface including a contact of a second polarity type; the contact of second polarity type of each III-V compound semiconductor multijunction solar cell of the plurality of III-V compound semiconductor multijunction solar cells making electrical contact with the first electrically conductive layer;
   a plurality of vias in the flexible support layer extending from the first side of the flexible support layer to the second electrically conductive layer on the second side of the flexible support layer; and
   a plurality of electrically conductive interconnects extending from the first side of the flexible support layer to the second electrically conductive layer, each respective electrically conductive interconnect of the plurality of electrically conductive interconnects making electrical contact with the contact of the first polarity type of a respective III-V compound semiconductor multijunction solar cell and extending through a respective via of the plurality of vias past the first electrically conductive layer without electrical contact to the first electrically conductive layer to make electrical contact with the second electrically conductive layer disposed directly on the second side of the flexible support layer,
   wherein the solar cell assembly is flexible and capable of being bent and/or rolled.

2. A solar cell assembly as defined in claim 1, wherein the first plurality of strips are parallel and of equal width.

3. A solar cell assembly as defined in claim 1, wherein each strip of the first plurality of strips has a width that increases from a free end of the strip to an end of the strip where the strip is electrically connected to the second terminal.

4. A solar cell assembly as defined in claim 1, wherein the first and second electrically conductive layers each have a thickness in the range of 5 to 50 microns.

5. A solar cell assembly as defined in claim 2, wherein each of the plurality of III-V compound semiconductor multijunction solar cells have a dimension in the range of 5 to 10 mm on a side.

6. A solar cell assembly as defined in claim 1, wherein the second electrically conductive layer comprises a second plurality of strips, wherein each strip of the second plurality of strips has a width that increases from a free end of the strip to an end of the strip where the strip is electrically connected to the first terminal.

7. A solar cell assembly as defined in claim 1, wherein the flexible support layer is a polyimide film having a thickness of between 25 and 100 microns.

8. A solar cell assembly as defined in claim 1, wherein each electrically conductive interconnect of the plurality of electrically conductive interconnects comprises an electrically conductive element extending from the contact of first polarity type of one of the plurality of III-V compound semiconductor multijunction solar cells to the second surface of the flexible support layer through a via of the plurality of vias.

9. A solar cell assembly as defined in claim 8, wherein each of the plurality of vias has a diameter of between 100 and 200 microns.

10. A solar cell assembly as defined in claim 1, wherein the first terminal is disposed on a first peripheral edge of the flexible support layer.

11. A solar cell assembly as defined in claim 10, wherein the second terminal is composed of a metallic strip extending parallel to the first peripheral edge of the flexible support layer.

12. A solar cell assembly as defined in claim 1, further comprising a bypass diode mounted in parallel with the plurality of III-V compound semiconductor multijunction solar cells and functioning as a bypass diode of the solar cell assembly.

13. A solar cell assembly as defined in claim 12, wherein the bypass diode has a top terminal of a first conductivity type and a bottom terminal of a second conductivity type, and the bottom terminal is mounted on and electrically connected to the first electrically conductive layer.

14. A solar cell assembly as defined in claim 1, wherein said first plurality of vias are arranged between adjacent strips of the plurality of strips.

15. A solar cell assembly as defined in claim 1, wherein the plurality of III-V compound semiconductor multijunction solar cells are arranged in an array comprising not less than 9 and not more than 36 III-V compound semiconductor multijunction solar cells.

16. A solar array panel comprising a plurality of modular solar cell assemblies, each solar cell assembly including a solar cell assembly interconnect which electrically and mechanically connects the solar cell assembly with an adjacent solar cell assembly, and wherein each solar cell assembly comprises:
 a flexible support layer comprising a first side and an opposing second side wherein the flexible support layer is electrically insulating;
 a first terminal of the module disposed on the second side of the flexible support layer;
 a first electrically conductive layer disposed directly on a portion of the first side of the flexible support layer, the first electrically conductive layer comprising a second terminal and a first plurality of strips extending away from the second terminal, wherein adjacent strips of the first plurality of strips are separated by a groove;
 a second electrically conductive layer disposed directly on a portion of the second side of the flexible support layer, the first terminal being connected to the second electrically conductive layer;
 a plurality of III-V compound semiconductor multijunction solar cells, organized into subsets of more than one III-V compound semiconductor multijunction solar cell and with each subject being mounted on a strip of the first plurality of strips layer, wherein each strip of the first plurality of strips extends beyond a periphery of the III-V compound semiconductor multijunction solar cells mounted thereon, and each III-V compound semiconductor multijunction solar cell comprising a top surface including a contact of first polarity type, and a rear surface including a contact of the second polarity type, the contact of second polarity type of each III-V compound semiconductor multijunction solar cell of the plurality of III-V compound semiconductor multijunction solar cells making electrical contact with the first electrically conductive layer;
 a plurality of vias in the flexible support layer extending within a groove from the first side of the flexible support layer to the second electrically conductive layer on the second side of the flexible support layer;
 a plurality of electrically conductive interconnects extending from the first side of the flexible support layer to the second electrically conductive layer, each respective electrically conductive interconnect of the plurality of electrically conductive interconnects making electrical contact with the contact of the first polarity type of a respective III-V compound semiconductor multijunction solar cell and extending through a respective via of the plurality of vias past the first electrically conductive layer without electrical contact to the first electrically conductive layer to make electrical contact with the second electrically conductive layer disposed directly on the second side of the flexible support layer,
 wherein the solar array panel is flexible and capable of being bent and/or rolled.

17. A space vehicle comprising:
 a payload disposed with the space vehicle; and a power source for the payload, comprising an array of solar assemblies mounted on a panel, each solar assembly comprising:
 a flexible support layer comprising a first side and an opposing second side wherein the flexible support layer is electrically insulating;
 a first terminal of the module disposed on the second side of the flexible support layer;
 a first electrically conductive layer disposed directly on a portion of the first side of the flexible support layer, the first electrically conductive layer comprising a second terminal and a first plurality of strips extending away from the second terminal, wherein adjacent strips of the first plurality of strips are separated by a groove;
 a second electrically conductive layer disposed directly on a portion of the second side of the flexible support layer, the first terminal being connected to the second electrically conductive layer;
 a plurality of III-V compound semiconductor multijunction solar cells organized into subsets of more than one III-V compound semiconductor multijunction solar cell and with, each subset being mounted on a strip of the first plurality of strips layer, wherein each strip of the first plurality of strips extends beyond a periphery of the III-V compound semiconductor multijunction solar cell mounted thereon, and each III-V compound semiconductor multijunction solar cell comprising a top surface including a contact of a first polarity type, and a rear surface including a contact of a second polarity type, the contact of second polarity type of each III-V compound semiconductor multijunction solar cell of the plurality of III-V compound semiconductor multijunction solar cells making electrical contact with the first electrically conductive layer;
 a plurality of vias in the flexible support layer extending within a groove from the first side of the flexible support layer to the second electrically conductive layer on the second side of the flexible support layer;
 a plurality of electrically conductive interconnects extending from the first side of the flexible support layer to the second side of the flexible support layer, each respective electrically conductive interconnect of the plurality of electrically conductive interconnects making electrical contact with the contact of first polarity type of a respective III-V compound semiconductor multijunction solar cell and extending through a respective via of the plurality of vias past the first electrically conductive layer without electrical contact to the first electrically conductive layer to make electrical contact with the second electrically conductive layer disposed directly on the second side of the flexible support layer,
 wherein the panel is flexible and capable of being wrapped around a mandrel prior to being deployed in space.

18. A solar array panel comprising a plurality of solar cell assemblies as defined in claim 1 wherein a second terminal of a first solar cell assembly is electrically connected to a first terminal of a second solar cell assembly.

* * * * *